(12) United States Patent
Lewis et al.

(10) Patent No.: US 10,090,425 B2
(45) Date of Patent: Oct. 2, 2018

(54) AXIALLY-INTEGRATED EPITAXIALLY-GROWN TANDEM WIRE ARRAYS

(71) Applicant: California Institute of Technology, Pasadena, CA (US)

(72) Inventors: Nathan S. Lewis, La Canada Flintridge, CA (US); Shu Hu, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 13/771,617

(22) Filed: Feb. 20, 2013

(65) Prior Publication Data

US 2013/0213462 A1    Aug. 22, 2013

Related U.S. Application Data

(60) Provisional application No. 61/601,430, filed on Feb. 21, 2012.

(51) Int. Cl.
| | |
|---|---|
| H01L 31/0352 | (2006.01) |
| C25B 1/00 | (2006.01) |
| H01L 31/0687 | (2012.01) |
| H01L 31/078 | (2012.01) |
| H01L 31/18 | (2006.01) |

(Continued)

(52) U.S. Cl.
CPC .. *H01L 31/035236* (2013.01); *C01B 13/0207* (2013.01); *C25B 1/003* (2013.01); *C25B 9/08* (2013.01); *H01L 31/03529* (2013.01); *H01L 31/035281* (2013.01); *H01L 31/0687* (2013.01); *H01L 31/078* (2013.01); *H01L 31/1804* (2013.01); *H01L 31/1892* (2013.01); *Y02E 10/544* (2013.01); *Y02E 10/547* (2013.01); *Y02P 70/521* (2015.11)

(58) Field of Classification Search
CPC ..... H01L 31/035236; H01L 31/035227; H01L 31/03529; C25H 1/02; C25H 1/0207; C25H 1/04; Y02E 10/50
USPC ........................................................ 977/720
See application file for complete search history.

(56) References Cited

U.S. PATENT DOCUMENTS

| | | | |
|---|---|---|---|
| 4,358,676 A | 11/1982 | Childs et al. | |
| 4,387,265 A * | 6/1983 | Dalal | 136/249 |
| 5,314,569 A | 5/1994 | Pribat | |

(Continued)

FOREIGN PATENT DOCUMENTS

| | | |
|---|---|---|
| CN | 1669920 A | 9/2005 |
| CN | 1676568 A | 10/2005 |

(Continued)

OTHER PUBLICATIONS

Cambridge University Definition of an ohmic contact.*

(Continued)

*Primary Examiner* — Bethany L Martin
(74) *Attorney, Agent, or Firm* — Gavrilovich, Dodd & Lindsey LLP (57) ABSTRACT

A photoelectrode, methods of making and using, including systems for water-splitting are provided. The photoelectrode can be a semiconducting material having a photocatalyst such as nickel or nickel-molybdenum coated on the material. The photoelectrode includes an elongated axially integrated wire having at least two different wire compositions.

11 Claims, 4 Drawing Sheets

(51) Int. Cl.
  *C01B 13/02* (2006.01)
  *C25B 9/08* (2006.01)

(56) References Cited

U.S. PATENT DOCUMENTS

| | | |
|---|---|---|
| 5,336,558 A | 8/1994 | Debe |
| 5,352,651 A | 10/1994 | Debe |
| 5,976,957 A | 11/1999 | Westwater et al. |
| 6,306,734 B1 | 10/2001 | Givargizov |
| 6,518,494 B1 | 2/2003 | Shibuya et al. |
| 6,649,824 B1 | 11/2003 | Den |
| 6,720,459 B2 | 4/2004 | Curtis et al. |
| 7,057,881 B2 | 6/2006 | Chew et al. |
| 7,105,428 B2 | 9/2006 | Pan et al. |
| 7,109,517 B2 | 9/2006 | Zaidi |
| 7,116,546 B2 | 10/2006 | Chew |
| 7,148,417 B1 | 12/2006 | Landis |
| 7,238,594 B2 | 7/2007 | Fenash et al. |
| 7,253,017 B1 | 8/2007 | Roscheisen et al. |
| 7,253,442 B2 | 8/2007 | Huang |
| 7,259,324 B2 | 8/2007 | Zeira |
| 7,309,620 B2 | 12/2007 | Fonash et al. |
| 7,335,259 B2 | 2/2008 | Hanrath et al. |
| 7,521,274 B2 | 4/2009 | Hersee et al. |
| 7,560,366 B1 | 7/2009 | Romano et al. |
| 7,592,555 B2 | 9/2009 | Kuekes et al. |
| 7,666,708 B2 | 2/2010 | Lieber et al. |
| 7,818,816 B1 | 10/2010 | Reppert et al. |
| 7,820,064 B2 | 10/2010 | Jin |
| 7,932,106 B2 | 4/2011 | Li |
| 7,998,788 B2 | 8/2011 | Guba et al. |
| 2002/0172820 A1 | 11/2002 | Majumdar et al. |
| 2003/0048666 A1* | 3/2003 | Eldridge ............... H01L 27/115 365/185.28 |
| 2004/0213307 A1 | 10/2004 | Lieber et al. |
| 2005/0098204 A1 | 5/2005 | Roscheisen et al. |
| 2005/0167647 A1 | 8/2005 | Huang et al. |
| 2005/0227391 A1 | 10/2005 | Jin et al. |
| 2005/0253138 A1 | 11/2005 | Choi et al. |
| 2005/0279274 A1 | 12/2005 | Niu et al. |
| 2006/0118791 A1 | 6/2006 | Leu |
| 2006/0207647 A1* | 9/2006 | Tsakalakos ............ B82Y 20/00 136/256 |
| 2007/0032076 A1 | 2/2007 | Lee et al. |
| 2007/0099008 A1 | 5/2007 | Shimizu et al. |
| 2007/0122313 A1 | 5/2007 | Li et al. |
| 2007/0157964 A1 | 7/2007 | Gronet |
| 2007/0166899 A1 | 7/2007 | Yao et al. |
| 2007/0232028 A1 | 10/2007 | Lee et al. |
| 2007/0278476 A1 | 12/2007 | Black |
| 2008/0006319 A1 | 1/2008 | Bettge et al. |
| 2008/0041439 A1 | 2/2008 | Achutharaman et al. |
| 2008/0047604 A1 | 2/2008 | Korevaar et al. |
| 2008/0072961 A1 | 3/2008 | Liang et al. |
| 2008/0075954 A1 | 3/2008 | Wardle et al. |
| 2008/0093698 A1 | 4/2008 | Tsakalakos et al. |
| 2008/0105296 A1* | 5/2008 | Samuelson ............ B82Y 10/00 136/255 |
| 2008/0110486 A1 | 5/2008 | Tsakalakos et al. |
| 2008/0134089 A1 | 6/2008 | Tsakalakos et al. |
| 2008/0169017 A1 | 7/2008 | Korevaar et al. |
| 2008/0276987 A1 | 11/2008 | Flood |
| 2008/0315430 A1 | 12/2008 | Weber et al. |
| 2009/0020150 A1* | 1/2009 | Atwater et al. ............ 136/246 |
| 2009/0020853 A1 | 1/2009 | Kayes et al. |
| 2009/0050204 A1 | 2/2009 | Habib |
| 2009/0032412 A1 | 3/2009 | Lewis et al. |
| 2009/0057839 A1 | 3/2009 | Lewis et al. |
| 2009/0078303 A1 | 3/2009 | Brezoczky et al. |
| 2009/0127540 A1 | 5/2009 | Taylor |
| 2009/0152527 A1 | 6/2009 | Lee et al. |
| 2009/0165844 A1 | 7/2009 | Dutta |
| 2009/0165849 A1 | 7/2009 | Chan et al. |
| 2009/0266411 A1 | 10/2009 | Habib et al. |
| 2010/0089440 A1* | 4/2010 | Gray et al. ............... 136/255 |
| 2010/0108131 A1 | 5/2010 | Guha et al. |
| 2010/0175748 A1 | 7/2010 | Karg |
| 2010/0186809 A1 | 7/2010 | Samuelson et al. |
| 2010/0212728 A1* | 8/2010 | Hori et al. ............... 136/255 |
| 2010/0326496 A1* | 12/2010 | Bhattacharya et al. ...... 136/249 |
| 2011/0096218 A1 | 4/2011 | Bratkovski et al. |
| 2011/0253982 A1 | 10/2011 | Wang et al. |
| 2012/0031486 A1 | 2/2012 | Parce et al. |
| 2012/0132930 A1* | 5/2012 | Young et al. ............... 257/84 |

FOREIGN PATENT DOCUMENTS

| | | |
|---|---|---|
| CN | 1808688 A | 7/2006 |
| JP | 6-508678 | 9/1994 |
| JP | 11-214720 | 8/1999 |
| JP | 2000-269561 | 9/2000 |
| JP | 2001-135516 | 5/2001 |
| JP | 2004-152787 | 5/2004 |
| JP | 2005-310388 | 4/2005 |
| JP | 2005-194609 | 7/2005 |
| JP | 2005-111200 | 10/2005 |
| JP | 2005-303301 | 10/2005 |
| JP | 2005-310821 | 11/2005 |
| JP | 2006-128233 | 5/2006 |
| JP | 2007-091485 | 4/2007 |
| JP | 2007-126311 | 5/2007 |
| JP | 2008-053730 | 3/2008 |
| JP | 2009-537339 A | 10/2009 |
| KR | 10-2007-18457 | 2/2007 |
| KR | 10-2008-0044181 A | 5/2008 |
| KR | 10-2010-0090077 | 8/2010 |
| KR | 10-2011-0068216 | 6/2011 |
| WO | 93/00560 | 1/1993 |
| WO | 2003/005450 A2 | 1/2003 |
| WO | 2006/138671 A2 | 12/2006 |
| WO | 2008/054541 A2 | 5/2008 |
| WO | 2008/135905 A2 | 11/2008 |
| WO | 2009/012459 A2 | 1/2009 |
| WO | 2009/032412 A1 | 3/2009 |

OTHER PUBLICATIONS

Wikipedia Entry on "Ohmic Contacts".*
Boettcher et al, Photoelectrochemical Hydrogen Evolutoin Using Si Microwire Arrays, Jan. 7, 2011, Jounral of the American Chemical Society, 133, 1216-1219.*
Kim, Do Weon, International Search Report and Written Opinion, PCT/US2013/026909, dated Jul. 25, 2013, Korean Intellectual Property Office.
Meissner et al., "Light-Induced Generation of Hydrogen at CdS-Monograin Membranes", Chemical Physics Letters, vol. 96, No. 1, Mar. 25, 1983, pp. 34-37.
Min et al., "Semiconductor Nanowires Surrounded by Cylindrical Al2O3 shells", Journal of Electronic Materials, 2003, 1344-1348.
Mohan et al., "Controlled growth of highly uniform, axial/radial direction-defined, individually addressable InP nanowire arrays", Nanotechnology 16 (2005) 2903-2907.
Morales et al., "A Laser Ablation Method for the Synthesis of Crystalline Semiconductor Nanowires", Science, 79, 208-211 (1998).
Morin et al., "Biomimetic Assembly of Zinc Oxide Nanorods onto Flexible Polymers", J. Am. Chem. Soc., 2007, 129 (45), 13776-13777.
Muskens et al., "Design of Light Scattering in Nanowire Materials for Photovoltaic Applications", Nano Letters, 2008, vol. 8, No. 9, 2638-2642.
Oh, Je Uk, Search Report and Written Opinion issued in PCT/US2010/058314, Korean Intellectual Property Office, dated Aug. 12, 2011.
Oh, Je Uk, Search Report and Written Opinion issued in PCT/US2011/029663, Korean Intellectual Property Office, dated Jan. 10, 2012.
Park, Jae Hun, Search Report for PCT/US2008/070495, Korean Intellectual Property Office, dated Feb. 20, 2009.
Park, Jae Hun, Written Opinion for PCT/US2008/070495, Korean Intellectual Property Office, dated Feb. 20, 2009.

(56) References Cited

OTHER PUBLICATIONS

Park, Jae Hun, Search Report for PCT/US2008/070523, Korean Intellectual Property Office, dated Feb. 20, 2009.
Park, Jae Hun, Written Opinion for PCT/US2008/070523, Korean Intellectual Property Office, dated Feb. 20, 2009.
Park, Jae Hun, Search Report for PCT/US2008/070518, Korean Intellectual Property Office, dated Feb. 20, 2009.
Park, Jae Hun, Written Opinion for PCT/US2008/070518, Korean Intellectual Property Office, dated Feb. 20, 2009.
Paulson et al., "Spectroscopic ellipsometry investigation of optical and interface properties of CdTe films deposited on metal foils", Solar Energy Materials & Solar Cells, 82 (2004) 279-90.
Peng et al., "Fabrication of Large-Area Silicon Nanowire p-n Junction Diode Arrays", Adv. Mater., 2004, 16 (1), 73-76.
Peng et al., "Aligned Single-Crystalline Si Nanowire Arrays for Photovoltaic Applications", Small, 2005, 1, 1062-1067.
Plass et al., "Flexible Polymer-Embedded Si Wire Arrays", Advanced Materials, 21, 325-328, published online Nov. 14, 2008.
Pushparaj et al., "Flexible energy storage devices based on nanocomposite paper", PNAS, Aug. 21, 2007, vol. 104, No. 34, pp. 13574-13577.
Putnam et al., "Secondary Ion Mass Spectrometry of Vapor-Liquid-Solid Grown, Au-Catalyzed, Si Wires", Nano Letters, 2008, vol. 8, No. 10, 3109-3113.
Putnam, M. et al., "10 m minority-carrier diffusion lengths in Si wires synthesized by Cu-catalyzed vapor-liquid-solid growth", Applied Physics Letters, 2009, 95:163116.1-163116-3.
Raravikar et al., "Embedded Carbon-Nanotube-Stiffened Polymer Surfaces", Small, 1 (3), 317 (2005).
Ray, Jayati, First Office Action, Australian Patent Office, Application No. 2008275878, dated Nov. 14, 2012.
Rosenbluth et al., "630-mV open circuit voltage, 12% efficient n-Si liquid junction", Appl. Phys. Lett., 1985, 45, 423-425.
Rosenbluth et al., "Kinetic Studies of Carrier Transport and Recombination at the n-Silicon/Methanol Interface", Journal of the American Chemical Society, vol. 108, No. 16, Aug. 6, 1986, pp. 4689-4695.
Rosenbluth et al., "'Ideal' Behavior of the Open Circuit Voltage of Semiconductor/Liquid Junctions", 1989, 93, 3735-3740.
Routkevitch et al., "Electrochemical Fabrication of CdS Nanowire Arrays in Porous Anodic Aluminum Oxide Templates", J. Phys. Chem. 1996, 100, 14037-14047.
Routkevitch et al., "Nonlithographic Nano-Wire Arrays: Fabrication, Physics, and Device Applications", IEEE Transactions on Electron Devices, vol. 43, No. 10, 1996, pp. 1646-1658.
Sah et al., "Recombination Properties of the Gold Acceptor Level in Silicon using the Impurity Photovoltaic Effect", Phys. Rev. Lett., 1967, 40:71-72.
Sansom et al., "Controlled partial embedding of carbon nanotubes within flexible transparent layers", Nanotechnology, 19, 035302 (2008).
Sayad et al., "Determination of diffusion length in photovoltaic crystalline silicon by modelisation of light beam induced current", Superlattices and Microstructures, 45 (2009), 393-401.
Schmidt et al., "Diameter-Dependent Growth Direction of Epitaxial Silicon Nanowires", Nano Letters, 2005, vol. 5, No. 5, 931-935.
Seibt et al.,"Characterization of haze-forming precipitates in silicon", J. Appl. Physics, 1988, 63:4444-4450.
Shchetinin et al., "Photoconverters Based on Silicon-Crystal Whiskers", Translated from Izmerital'naya Teknika, No. 4, pp. 35-36, 1978.
Shimizu et al., "Synthesis of Vertical High-Density Epitaxial Si(100) Nanowire Arrays on a Si(100) Substrate Using an Anodic Aluminum Oxide Template", Advanced Materials, 19, 917-920 (2007).
Shockley et al., "Detailed Balance Limit of Efficiency of p-n Junction Solar Cells", J. of Applied Physics, vol. 32, No. 3, 1961, 510-519.
Sivakov, V. et al., "Silicon Nanowire-Based Solar Cells on Glass: Synthesis, Optical Properties, and Cell Parameters", Nano Letters, 2009, vol. 9, No. 4, 1549-1554.
Spurgeon et al., "Repeated epitaxial growth and transfer of arrays of patterned, vertically aligned, crystalline Si wires from a single Si(111) substrate", Applied Physics Letters, 2008, 93:032112-1-032112-3.
Stelzner et al., "Silicon nanowire-based solar cells", Nanotechnology, 2008, 19:295203-1-295203-4.
Struthers, J.D., "Solubility and Difusivity of Gold, Iron, and Copper in Silicon", J. Appl. Phys, 27, 1956, p. 1560.
Sunden et al., "Microwave assisted patterning of vertically aligned carbon nanotubes onto polymer substrates", J. Vac. Sci. Technol. B 24(40 Jul./Aug. 2006, pp. 1947-1950.
Sze, M., "Physics of Semiconductor Devices", 2nd Edition, Wiley, New York, 1981, p. 21.
Takayama et al., "Topographical Micropatterning of Poly(dimethylsiloxane) Using Laminar Flows of Liquids in Capillaries", Advanced Materials, 2001, 13:570-574.
Thai, Luan C., Non-Final Office Action, U.S. Appl. No. 12/176,100, USPTO, Jan. 6, 2010.
Tian et al., "Coaxial silicon nanowires as solar cells and nanoelectronic power sources", Nature, 2007, 449:885-889.
Tiedje, T. et al., "Limiting efficiency of silicon solar cells", IEEE Transactions on Electron Devices, 1984, ED-31: 711-716.
Touskova et al., "Preparation and characterization of CdS/CdTe thin film solar cells", Thin Solid Films, 293 (1997) 272-276.
Tsakalakos et al., "Silicon nanowire solar cells", Applied Physics Letters, 91, 2007, 233117-1-233117-3.
Tsakalakos et al., "Strong broadband optical absorption in silicon nanowire films", J. of Nanophotonics, 2007, 1 , 013552-1-013552-10.
Wagner et al., "Vapor-Liquid-Solid Mechanism of Single Crystal Growth", Applied Physics Letters, Mar. 1, 1964, vol. 4, No. 5, pp. 89-90.
Guttler, G. et al., "Photovoltaic Effect of Gold in Silicon", J. Appl. Phys., 1969, 40:4994-4995.
Guttler, G. et al., "Impurity Photovoltaic Effect in Silicon", Energy Conversion, 1970, 10:51-55.
Haick et al., "Electrical Characteristics and Chemical Stability of Non-Oxidized, Methyl-Terminated Silicon Nanowires", J. Am. Chem. Soc., 2006, 128, 8990-8991.
Harris et al., "Semiconductors for Photoelectrolysis", Ann Rev. Mater. Sci., 1978, 8:99-134.
Haxel et al., "Rare Earth Elements—Critical Resources for High Technology", U.S. Geological Survey Fact Sheet, 087-02, 2002, p. 3.
Hochbaum et al., "Controlled Growth of Si Nanowire Arrays for Device Integration", Nano Letters, 2005, vol. 5, No. 3, 457-460.
Hopkins et al., "Impurity Effects in Silicon for High Efficiency Solar Cells", Journal of Crystal Growth 75 (1986) 67-79.
Hu et al., "Analysis of Optical Absorption in Silicon Nanowire Arrays for Photovoltaic Applications", Nano Letters, vol. 7, No. 11, Nov. 2007, 3249-3252.
Huang et al., "Microstructured silicon protector", Applied Physics Letters, 89, 033506.1-033506.3, 2006.
Huang et al., "Fabrication of Silicon Nanowire Arrays with Controlled Diameter, Length, and Density", Advanced Materials, 19, 744-748 (2007).
Huynh et al., "Hybrid Nanorod-Polymer Solar Cells", Science, 295, 2425 (2002).
Ismail et al., "Hydrogen Gas Production for Electronic-Grade Polycrystalline Silicon Growth", IEEE ICSE, 2002, 53-56.
Jacoboni et al., "A Review of Some Charge Transport Properties of Silicon", Solid State Electronics, 1977, vol. 20, 77-891.
Jenny et al., "Semiconducting Cadmium Telluride", Physical Review, vol. 96, No. 5, Dec. 1, 1954, 1190-1191.
Jung et al., "Aligned Carbon Nanotube-Polymer Hybrid Architectures for Diverse Flexible Electronic Applications", Nano Letters, 2006, vol. 6, No. 3, pp. 413-418.
Kang et al., "Hybrid solar cells with vertically aligned CdTe nanorods and a conjugated polymer", Applied Physics Letters, 86, Issue 11, 113101-1-113101-3 (2005).
Kang et al., "Well-aligned CdS nanorod/conjugated polymer solar cells", Solar Energy Materials & Solar Cells, 90 (2006) 166-174.

(56) References Cited

OTHER PUBLICATIONS

Kawano et al., "Fabrication and properties of ultrasmall Si wire arrays with circuits by vapor-liquid-solid growth", Sensors and Actuators, A 97-98 (2002) 709-715.

Kayes et al., "Comparison of the device physics principles of planar and radial p-n junction nanorod solar cells", Journal of Applied Physics, 2005, 97:114302.1-114302.11.

Kayes et al., "Radial PN Junction Nanorod Solar Cells: Device Physics Principles and Routes to Fabrication in Silicon", IEEE PVSC, 2005, pp. 55-58.

Kayes et al., "Synthesis and Characterization of Silicon Nanorod Arrays for Solar Cell Applications", IEEE WCPEC, 2006, 1, 221-224.

Kayes et al., "Growth of vertically aligned Si wire arrays over large areas (>1cm2) with Au and Cu Catalysts", Supplementary Material, App. Phys. Letter, 91, 103110 (2007).

Keevers et al., "Efficiency Improvements of Silicon Solar Cells by the Impurity Photovoltaic Effect", IEEE 1993, Photovoltaic Specialists Conference, 140-146.

Kelzenberg et al., "Photovoltaic Measurements in Single-Nanowire Silicon Solar Cells", Nano Letters, 2008, vol. 8, No. 2, pp. 710-714.

Kelzenberg et al., "Single-nanowire Si solar cells", 33rd IEEE Photovoltaic Specialists Conference, 2008, 1-6.

Kelzenberg et al., "Predicted efficiency of Si wire array solar cells," 34th IEEE Photovoltaic Specialists Conference, 2009, 001948-001953.

Kelzenberg et al., "Enhanced absorption and carrier collection in Si wire arrays for photovoltaic applications", Nature Materials, 2010, 9:239-244.

Kempa et al., "Single and Tandem Axial p-i-n. Nanowire Photovoltaic Devices", Nano Letters, 2008, vol. 8, No. 10, 3456-3460.

Kim et al. "Photovoltaic Properties of Nano-particulate and Nanorod Array ZnO Electrodes for Dye-Sensitized Solar Cell", Bull. Korean Chem. Soc., vol. 27, No. 2, 295-298, Feb. 2006.

Kim et al., "Stretchable and Foldable Silicon Integrated Circuits", Science, 2008, 320, 507-511.

Kim, Min Soo, International Search Report and Written Opinion issued in PCT/US2010/058422, Korean Intellectual Property Office, dated Sep. 16, 2011.

Klein et al., "Electrochemcial Fabrications of Cadmium Chalcogenide Microdiode Arrays", Chem. Mater., 1993, 5, 902-904.

Kressin et al., "Synthesis of Stoichiometric Cadmium Selenide Films via Sequential Monolayer Electrodeposition", Chem. Mater., 1991, 3, 1015-1020.

Kupec et al., "Dispersion, Wave Propagation and Efficiency Analysis of Nanowire Solar Cells," Optical Express, 2009, 17:10399-10410.

Lauhon et al., "Epitaxial core-shell and core-multishell nanowire heterostructures", Nature, vol. 420, Nov. 7, 2002, pp. 57-61.

Law et al., "Semiconductor Nanowires and Nanotubes", Annu. Rev. Mater. Res., 2004, 34:83-122.

Law et al., "Nanowire dye-sensitized solar cells", Nat. Mater., 2005, 4, 455-459.

Lee et al., "Solvent Compatibility of Poly(dimethylsiloxane)-Based Microfluidic Devices", Anal. Chem., 2003, 75, 6544-6554.

Lepiller et al., "New Facets of CdTe Electrodeposition in Acidic Solutions with Higher Tellurium Concentrations", Journal of the Electrochemical Society, 151 (5) C348-C357, 2004.

Lin et al., Efficient photoinduced charge transfer in TiO2 nanorod/conjugated polymer hybrid materials, Nanotechnology, 17 (2006), 5781-5785.

Lindner, Nora, International Preliminary Report on Patentability issued in PCT/US2010/058422, The International Bureau of WIPO, dated Jun. 14, 2012.

Lombardi et al., "Synthesis of High Density, Size-Controlled Si Nanowire Arrays via Porous Anodic Alamina Mask", Chem. Mater., 2006, 18, 988-991.

Lopatiuk-Tirpak et al., "Studies of minority carrier transport in ZnO", Superlattices and Microstructures, 42 (2007), 201-205.

Maiolo et al., "High Aspect Ratio Silicon Wire Array Photoelectrochemical Cells", J. Am. Chem. Soc., 129, 2007, 12346-12347.

Maiolo et al., "Macroporous Silicon as a Model for Silicon Wire Array Solar Cells", J. Phys. Chem. C 2008, 112, 6194-6201.

Marion et al., "Validation of a photovoltaic module energy ratings procedure at NREL", NREL Technical Report, 1999, NREL/TP-520-26909 1-48.

Marion et al., "Validation of a photovoltaic module energy ratings procedure at NREL", NREL Technical Report, 1999, NREL/TP-520-26909 49-97.

Martensson et al., "Fabrication of individually seeded nanowire arrays by vapour-liquid-solid growth", Nanotechnology, 14 (2003) 1255-1258.

McCandless et al., "Cadmium Telluride Solar Cells", In Handbook of Photovoltaic Science and Engineering, 2003, pp. 617-657.

McDonald et al., "Poly(dimethylsiloxane) as a Material for Fabricating Microfluidic Devices", Acc. Chem. Res., 2002, 35 (7), 491-499.

Bai, Lingfei, International Preliminary Report on Patentability, PCT/US2013/026909, The International Bureau of WIPO, dated Sep. 4, 2014.

Office Action issued in Japanese Patent Application No. 2010-522999, dated Mar. 5, 2013.

Office Action issued in Chinese Patent Application No. 200880107746.5, dated Sep. 27, 2011.

Office Action issued in Chinese Patent Application No. 20080102837.X, dated Oct. 9, 2011.

Altermatt, P. et al., "Simulation of optical properties of Si wire cells", 34th IEEE Photovoltaic Specialists Conference, 2009, 000972-000977.

Amra, C., "From light scattering to the microstructure of thin-film multilayers", Applied Optics, vol. 32, No. 28, p. 5481 (1993).

Anandan et al., "Room temperature growth of CuO nanorod arrays on copper and their application as a cathode in dye-sensitized solar cells", Materials Chemistry and Physics, 93 (2005), 35-40.

Anandan, Sambandam, "Recent improvements and arising challenges in dye-sensitized solar cells", Solar Energy Materials & Solar Cells, 91 (2007) 843-846.

Aspnes, D.E., "Optical functions of intrinsic c-Si for photon energies up to 7.5 eV: table", Properties of Crystalline Silicon, 1999, 683-690.

Baharlou, Simin, International Preliminary Report on Patentability issued in PCT/US2011/029663, The International Bureau of WIPO, dated Oct. 4, 2012.

Bai, Lingfei, International Preliminary Report on Patentability, PCT/US2010/058314, The International Bureau of WIPO, dated Jun. 14, 2012.

Balakrisnan et al., "Patterning PDMS using a combination of wet and dry etching", J. Micromech. Microeng., 19 (2009) 047002.1-047002.7.

Basol et al., "Ultra-Thin Electrodeposited CdS/CdTe Heterojunction with 8% Efficiency", IEEE Photo. Spec. Conf., 1982, 805-808.

Basol, B., "High-efficiency electroplated heterojunction solar cell", J. Appl. Phys. 55(2), 1984, pp. 601-603.

Basol, B., "Thin Film CdTe Solar Cells—A Review", Conf. Rec. IEEE Photo. Spec. Conf., 1990, 588-594.

Bhattacharya et al., "Electrodeposition of CdTe Thin Films", 1984, 131, 2032-2041.

Bierman et al., "Potential applications of hierchical branching nanowires in solar energy", Energy Environ. Sci., 2009, 1050-1059.

Boettcher, Shannon W. et al., "Energy-Conversion Properties of Vapor-Liquid-Solid-Grown Silicon Wire-Array Photocathodes", Science, 2010, 327:185-187.

Bogart et al., "Diameter-Controlled Synthesis of Silicon Nanowires Using Nanoporous Alumina Membranes", Adv. Mater. 2005, 17 (1), 114-117.

Brown et al., "Impurity photovoltaic effect: Fundamental energy conversion efficiency limits", Journal of Applied Physics, vol. 92, No. 3, 2002, 1329-1336.

Bullis, W.M., "Properties of Gold in Silicon", Solid-State Electronics, Pergamon Press, 1966, vol. 9, pp. 143-168.

(56) References Cited

OTHER PUBLICATIONS

Campbell et al., "The Limiting Efficiency of Silicon Solar Cells under Concentrated Sunlight", IEEE Transactions on Electron Devices, vol. ED-33, No. 2, 1986, 234-239.
Choi, Jeong Yoon, Search Report for PCT/US2008/070509, Korean Intellectual Property Office, dated Feb. 20, 2009.
Choi, Jeong Yoon, Written Opinion for PCT/US2008/070509, Korean Intellectual Property Office, dated Feb. 20, 2009.
Chu et al., "Large Area Polycrystalline Silicon Solar Cells on Unidirectionally Solidified Acid-Treated Metallurigcal Grade Silicon", Proc. IEEE Southeastcon, 1989, 1436-1441.
Colombo et al., "Gallium arsenide p-i-n radial structures for photovoltaic applications", Applied Physics Letters, 94, 2009, 173108-1-173108-3.
Davis, Jr. et al., "Impurities in Silicon Solar Cells", IEEE Transactions on Electron Devices, vol. ED-27, No. 4, Apr. 1980, 677.
de Dood, Michiel Jacob Andries, "Silicon photonic crystals and spontaneous emission", Thesis, Utrecht University, 2002.
Dong et al., "Coaxial Group III—Nitride Nanowire Photovoltaics", Nano Letters, 2009, vol. 9, No. 5, 2183-2187.
Erts et al., "High Density Germanium Nanowire Assemblies: Contact Challenges and Electrical Characterization", J. Phys. Chem. B2006, 110, 820-826.
Fan et al., "Semiconductor Nanowires: From Self-Organization to Patterned Growth", Small 2(6), 700-717 (2006).
Fan et al., "Well-ordered ZnO nanowire arrays on GaN substrate fabricated via nanosphere lithography", Journal of Crystal Growth, 287 (2006) 34-38.
Fan et al., "Three-dimensional nanonpillar-array photovoltaics on low-cost and flexible substrates", Nature Mater., 2009, 8:648-653.
Fang et al., "Long Germanium Nanowires Prepared by Electrochemical Etching", Nano Letters, 2006, vol. 6, No. 7, 1578-1580.
Forouhi et al., "Optical dispersion relations for amorphous semiconductors and amorphous dielectrics", Physical Review B, vol. 34, No. 10, 1986, 7018-7026.
Fulop et al., "High-efficiency electrodeposited cadmium telluride solar cells", Appl. Phys. Lett., 1982, 40, 327-328.
Garnett et al., "Silicon Nanowire Radial p-n Junction Solar Cells", JACS, 130, 9224-9225, published on line Jun. 25, 2008.
Garnett et al., "Light Trapping in Silicon Nanowire Solar Cells", Nano Letters, 2010, 10:1082-1087.
Ghebrebrhan et al., "Global optimization of silicon photovoltaic cell front coatings", Optics Express, Apr. 22, 2009.
Gibbons et al., "A 14% efficient nonaqueous semiconductor/liquid junction solar cell", Appl. Phys. Lett., 1984, 45, 1095-1097.
Givargizov, "Growth of Whiskers from the Vapor Phase", Highly Anisotropic Crystals, D. Reidel, Dordrecht, Holland, 1987, p. 169.
Goodey et al., "Silicon Nanowire Array Photoelectrochemical Cells", J. Am. Chem. Soc., 2007, 129 (41), 12344-12345.
Goto et al., "Molecular Nanojet in Water", Applied Phys. Express, 2 (2009) 035004-1-035004-2.
Goto et al., "Growth of Core-Shell InP Nanowires for Photovoltaic Application by Selective-Area Metal Organic Vapor Phase Epitaxy", Applied Physics Express 2 (2009) 035004-1-035004-3.
Gowrishankar et al., "Fabrication of densely packed, well-ordered, high-aspect-ratio silicon nanopillars over large areas using block copolymer lithography", Thin Solid Films, 2006, 513, 289-294.
Green, Ma, "Optical Properties of Silicon", pveducation.org, accessed Jan. 10, 2014.
Gronet et al., "n-Type silicon photoelectrochemistry in methanol: Design of a 10.1% efficient semiconductor/liquid junction solar cell", Proc. Natl. Acad. Sci. USA, vol. 80, pp. 1152-1156, Feb. 1983.
Gstrein et al., "Effects of Interfacial Energetics on the Effective Surface Recombination Velocity of Si/Liquid Contacts", J. Phys. Chem., B2002, 106, 2950-2961.
Gu et al., "Quantitative Measurement of the Electron and Hole Mobility-Lifetime Products in Semiconductor Nanowires", Nano Letters, 2006, vol. 6, No. 5, 948-952.
Gunawan et al., "Characteristics of vapor-liquid-solid grown silicon nanowire solar cells", Solar Energy Materials & Solar Cells, 93 (2009) 1388-1393.
Guo, L. Jay, "Nanoimprint Lithography: Methods and Material Requirements", Advanced Materials, 19, 495-513, 2007.
Wagner et al., "The Vapor-Liquid-Solid Mechanism of Crystal Growth and Its Application to Silicon", Trans. Metal. Soc. AIME, 1965, 233 (6), 1053-1064.
Wagner et al., "Defects in Silicon Crystals Grown by the VLS Technique", J. of Applied Physics, vol. 38, No. 4, 1967, 1554-1560.
Wang et al., "Titania-nanotube-array-based photovoltaic cells", Appl. Phys. Lett, 89, 023508 (3 pages), 2006.
Westwater et al., "Control of the Size and Position of Silicon Nanowires Grown via the Vapor-Liquid-Solid Technique", Jpn. J. Appl. Phys., vol. 36 (1997) pp. 6204-6209.
Westwater et al., "Si Nanowires Grown via the Vapour-Liquid-Solid Reaction", Phys. Stat. Sol. (a) 165, 37-42 (1998).
Wolf et al., "Limitations and Possibilities for Improvement of Photovoltaic Solar Energy Converters* Part I: Considerations for Earth's Surface Operations", Proceedings of IRE, 1960, 48:1246-1263.
Wolfbauer, Georg, Communication Pursuant to Rule 70(2) and 70a(2) EPC, European Patent Application No. 08782075.9, dated Oct. 18, 2011.
Wolfbauer, Georg, Communication Pursuant to Article 94(3) EPC, European Patent Application No. 08782075.9, dated Mar. 5, 2014.
Woodruff et al., "Vertically Oriented Germanium Nanowires Grown from Gold Colloids on Silicon Substrates and Subsequent Gold Removal", Nano Letters, 2007, vol. 7, No. 6, 1637-1642.
Wu et al., "A Study on Deep Etching of Silicon Using Ethylene-Diamine-Pyrocatechol-Water", Sensors and Actuators, 9 (1986) 333-343.
Wu et al., "Semiconductor nanowire array: potential substrates for photocatalysis and photovoltaics", Topics in Catal., 2002, 19 (2), 197-202.
Xia et al., "One-Dimensional Nanostructures: Synthesis, Characterization, and Applications", Adv. Mater., 2003, 15(5), 353-389.
Yablonovitch, E. et al., "Statistical ray optics", Journal of the Optical Society of America, 1982, 72:899-907.
Yablonovitch, E. et al., "Unusually low surface-recombination velocity on silicon and germanium surfaces", Physical Review Letters, 1986, 57:249-252.
Yang et al., "Experimental Observation of an Extremely Dark Material by a Low-Density Nanotube Array", Nano Letters, 2008, vol. 8, No. 2, 446-451.
Yao et al., "Si nanowires synthesized with Cu catalyst", Materials Letters, 61 (2007), pp. 177-181.
Yoon et al., "Minority Carrier Lifetime and Radiation Damage Coefficients of Germanium", Conference Record of the Thirty-First IEEE, Photovoltaic Specialists Conference, Jan. 3-7, 2005, pp. 842-845.
Yoon et al., "Ultrathin silicon solar microcells for semitransparent, mechanically flexible and microconcentrator module designs", Nat. Mater., 2008, 7:907-915.
Yu et al., "Silicon Nanowires: Preparation, Device Fabrication, and Transport Properties", J. Phys. Chem. B 2000, 104, 11864-11870.
Yu et al., "Large-area blown bubble films of aligned nanowires and carbon nanotubes", Nat. Nanotechnol., 2007, 2 (6) 372-377.
Zach et al., "Synthesis of Molybdenum Nanowires with Millimeter-Scale Lengths Using Electrochemical Step Edge Decoration", Chem. Mater. 2002, 14, 3206-3216.
Zhu et al., "Optical Absorption Enhancement in Amorphous Silicon Nanowire and Nanocone Arrays", Nano Letters, 2009, vol. 9, No. 1, 279-282.

* cited by examiner

AXIALLY-INTEGRATED EPITAXIALLY-GROWN TANDEM WIRE ARRAYS

CROSS REFERENCE TO RELATED APPLICATIONS

This application claims priority to U.S. Provisional Application Ser. No. 61/601,430, filed Feb. 21, 2012, the disclosure of which is incorporated herein by reference.

STATEMENT REGARDING FEDERALLY SPONSORED RESEARCH

This invention was made with government support under grant numbers DE-SC0004993 and T-105550 awarded by the U.S. Department of Energy. The government has certain rights in the invention.

TECHNICAL FIELD

This invention relates to photovoltaic cells, devices, methods of making and uses thereof.

BACKGROUND

Ordered arrays of crystalline-Si (c-Si) microwires, fabricated by the chemical-vapor-deposition, vapor-liquid-solid (CVD-VLS) growth mechanism, were pioneered nearly five years ago for sunlight-to-electrical power conversion. P-type Si microwire arrays, employing a thin n+-doped emitter layer to form a buried junction (n+p-Si), have since realized sunlight-to-electrical power-conversion efficiencies>7% from solid-state photovoltaic (PV) devices, and >5% power-conversion efficiency toward $H_2$ evolution from acidic aqueous electrolytes when functionalized with Pt electrocatalysts. In the absence of additional processing-intensive steps for light absorption enhancement, these devices demonstrated a short-circuit (maximum) current density ($j_{sc}$)≈9 mA/cm$^2$, open-circuit (maximum) photopotential ($V_{oc}$)≈0.53 V, and fill factor≈70%. The product of these three terms determines the power-conversion efficiency of the device. The Si microwire geometry uses ~5% of the material required for conventional wafer-based photovoltaics (PVs) and absorbs ~20% of above bandgap sunlight. Various designs to alter the path of light and increase absorption by the Si microwire arrays, and thus $j_{sc}$ and the efficiency, have been investigated with modest success.

Recent photoelectrochemical study of radial junction Si microwire arrays exhibited 520 mV open-circuit voltages under AM 1.5 G 1-sun illumination, with the pH-independent, one-electron, outer sphere, methyl viologen redox system. Thus, the problem to-date is that with solely a single Si microwire array, increasing the efficiency beyond ~7% is difficult.

SUMMARY

The disclosure provides a nano- or micro-wire or nano- or micro-wire array comprising a plurality of axial-integrated epitaxially-grown tandem wires comprising at least a first junction comprising a first semiconducting material and at least a second junction comprising a different semiconducting material. In one embodiment, the at least first junction and at least second junction are separated by an ohmic layer. In one embodiment, the ohmic layer and at least second layer comprise a semiconducting material each individually selected from the group consisting of $TiO_2$, $CaTiO_3$, $SrTiO_3$, $Sr_3Ti_2O_7$, $Sr_4Ti_3O_{10}$, $Rb_2La_2Ti_3O_{10}$, $Cs_2La_2Ti_3O_{10}$, $CsLa_2Ti_2NbO_{10}$, $La_2TiO_5$, $La_2Ti_3O_9$, $La_2Ti_2O_7$, $La_2Ti_2O_7$:Ba, $KaLaZr_{0.3}Ti_{0.7}O_4$, $La_4CaTi_5O_{17}$, $KTiNbO_5$, $Na_2Ti_6O_{13}$, $BaTi_4O_9$, $Gd_2Ti_2O_7$, $Y_2Ti_2O_7$, $ZrO_2$, $K_4Nb_6O_{17}$, $Rb_4Nb_6O_{17}$, $Ca_2Nb_2O_7$, $Sr_2Nb_2O_7$, $Ba_5Nb_4O_{15}$, $NaCa_2Nb_3O_{10}$, $ZnNb_2O_6$, $Cs_2Nb_4O_{11}$, $La_3NbO_7$, $Ta_2O_5$, $KsPrTa_5O_{15}$, $K_3Ta_3Si_2O_{13}$, $K_3Ta_3B_2O_{12}$, $LiTaO_3$, $KTaO_3$, $AgTaO_3$, $KTaO_3$:Zr, $NaTaO_3$:La, $NaTaO_3$:Sr, $Na_2Ta_2O_6$, $CaTa_2O_6$, $SrTa_2O_6$, $NiTa_2O_6$, $Rb_4Ta_6O_{17}$, $Ca_2Ta_2O_7$, $Sr_2Ta_2O_7$, $K_2SrTa_2O_7$, $RbNdTa_2O_7$, $H_2La_{2/3}Ta_2O_7$, $K_2Sr_{1.5}Ta_3O_{10}$, $LiCa_2Ta_3O_{10}$, $KBa_2Ta_3O_{10}$, $Sr_5Ta_4O_{15}$, $Ba_2Ta_4O_{15}$, $H_{1.8}Sr_{0.81}Bi_{0.19}Ta_2O_7$, Mg—Ta Oxide, $LaTaO_4$, $LaTaO_7$, $PbWO_4$, $RbWNbO_6$, $RbWTaO_6$, $CeO_2$:Sr, $BaCeO_3$, $NaInO_2$, $CaIn_2O_4$, $SrIn_2O_4$, $LaInO_3$, $Y_xIn_{2-x}O_3$, $NaSbO_3$, $CaSb_2O_6$, $Ca_2Sb_2O_7$, $Sr_2Sb_2O_7$, $Sr_2SnO_4$, $ZnGa_2O_4$, $Zn_2GeO_4$, $LiInGeO_4$, $Ga_2O_3{}^b$, $Ga_2O_3$:$Zn^c$, $Na_2Ti_3O_7$, $K_2Ti_2O_5$, $K_2Ti_4O_9$, $Cs_2Ti_2O_5$, $H^+$—$Cs_2Ti_2O_5$, $Cs_2Ti_5O_{11}$, $Cs_2Ti_6O_{13}$, $H^+$—$CsTiNbO_5$, $H^+$—$CsTi_2NbO_7$, $SiO_2$-pillared $K_2Ti_4O_9$, $SiO_2$-pillared $K_2Ti_{2.7}Mn_{0.3}O_7$, $Na_2W_4O_{13}$, $H^+$—$KLaNb_2O_7$, $H^+$—$RbLaNb_2O_7$, $H^+$—$CsLaNb_2O_7$, $H^+$—$KCa_2Nb_3O_{10}$, $SiO_2$-pillared $KCa_2Nb_3O_{10}$, ex-$Ca_2Nb_3O_{10}/K^+$ nanosheet[4], Restacked ex-$Ca_2Nb_3O_{10}/Na^+$, $H^+$—$RbCa_2Nb_3O_{10}$, $H^+$—$CsCa_2Nb_3O_{10}$, $H^+$—$KSr_2Nb_3O_{10}$, $H^+$—$KCa_2NaNb_4O_{13}$, $Bi_2W_2O_9$, $Bi_2Mo_2O_9$, $Bi_4Ti_3O_{12}$, $BaBi_4Ti_4O_{15}$, $Bi_3TiNbO_9$, $PbMoO_4$, $(NaBi)_{0.5}MoO_4$, $(AgBi)_{0.5}MoO_4$, $(NaBi)_{0.5}WO_4$, $(AgBi)_{0.5}WO_4$, $Ga_{1.14}In_{0.86}O_3$, $\beta$-$Ga_2O_3$, $Ti_{1.5}Zr_{1.5}(PO_4)_4$, $WO_3$, $Bi_2WO_6$, $Bi_2MoO_6$, $Bi_2Mo_3O_{12}$, $Zn_3V_2O_8$, $Na_{0.5}Bi_{1.5}VMoO_8$, $In_2O_3(ZnO)_3$, $SrTiO_3$:Cr/Sb, $SrTiO_3$:Ni/Ta, $SrTiO_3$:Cr/Ta, $SrTiO_3$:Rh, $CaTiO_3$:Rh, $La_2Ti_2O_7$:Cr, $La_2Ti_2O_7$:Fe, $TiO_2$:Cr/Sb, $TiO_2$:Ni/Nb, $TiO_2$:Rh/Sb, $PbMoO_4$:Cr, $RbPb_2Nb_3O_{10}$, $PbBi_2Nb_2O_9$, $BiVO_4$, $BiCu_2VO_6$, $BiZn_2VO_6$, $SnNb_2O_6$, $AgNbO_3$, $Ag_3VO_4$, $AgLi_{1/3}Ti_{2/3}O_2$, $AgLi_{1/3}Sn_{2/3}O_2$, $LaTiO_2N$, $Ca_{0.25}La_{0.75}TiO_{2.25}N_{0.75}$, $TaON$, $Ta_3N_5$, $CaNbO_2N$, $CaTaO_2N$, $SrTaO_2N$, $BaTaO_2N$, $LaTaO_2N$, $Y_2Ta_2O_5N_2$, $TiN_xO_yF_z$, $Sm_2Ti_2O_5S_2$, La—In oxysulfide, GaAs, GaP, $GaAs_xP_{1-x}$, $Al_xGa_{1-x}$, As, $Al_xGa_{1-x}As_yP_{1-y}$, $In_xGa_{1-x}As$, $In_xGa_{1-x}P$, $In_xGa_{1-x}As_yP_{1-y}$, $Al_xIn_{1-x}As_yP_{1-y}$, $Al_xGa_{1-x}As_yN_zP_{1-y-z}$, $In_xGa_{1-x}As_yN_zP_{1-y-z}$, $Zn_3P_2$, $Zn_3S_2$, and $ZnP_xS_{1-x}$ (0≤x≤1, 0≤y≤1, 0≤z≤1, 0≤y+z≤1). In another embodiment, the microwire has a dimension comprising 500 nm to about 10 micrometers in diameter and about 1 micrometer to 1 mm in length and wherein the nanowire has a mean diameter less than 1 micrometer and a length of less than 1 micrometer. In yet another embodiment, the nano- or micro-wire has an aspect ratio of each of the at least first junctions are greater than 1. In yet another embodiment, the first semiconductive material is Si. In yet another embodiment, the at least first junction is surface coated by a passivation layer. In yet another embodiment of any of the foregoing the nano- or micro-wire is substantially embedded in a material selected from the group consisting of glass, polymer and wax. In another embodiment, the material forms a membrane comprising the nano- or micro-wire embedded in the material extending from and/or through a first surface to and/or through a second surface of the membrane. In another embodiment of any of the foregoing the ends of the microwire are coated with a catalyst.

The disclosure also provides a method of making a nano- or micro-wire of the disclosure comprising (a) fabricating a first junction structures on a Si substrate comprising (i) forming a templated oxide layer on the substrate, wherein the template for the templated oxide layer comprises openings in the oxide layer for the formation of a first junction structure; and (ii) growing a set of first junction structures on the substrate, wherein the first junction structure growth is supported by a catalyst deposited in the openings in the oxide layer; (b) encapsulating the fabricated first junction structures in a passivation layer; (c) etching the passivation layer to expose an end of the first junction structure; and (d) growing a second junction structure on the exposed end of the first junction structure. In yet another embodiment, he encapsulating of (b) comprises depositing $SiO_2$, $Si_3N_4$, $SiO_xN_y$, or amorphous Si on the first junction structure. In another embodiment, the second junction structure is grown by a metal-organic chemical vapor deposition (MOCVD) system or a molecular beam epitaxy (MBE) system. In a further embodiment, the method further comprises after (c) depositing an ohmic contact layer on the exposed end of the first junction structure. In yet another embodiment, the ohmic contact comprises a semiconductive material. In a further embodiment the ohmic contact comprises a material selected from the group consisting of GaAs, GaP, $GaAs_xP_{1-x}$, $Al_xGa_{1-x}$, As, $Al_xGa_{1-x}As_yP_{1-y}$, $In_xGa_{1-x}As$, $In_xGa_{1-x}P$, $In_xGa_{1-x}As_yP_{1-y}$, $Al_xIn_{1-x}As_yP_{1-y}$, $Al_xGa_{1-x}As_yN_zP_{1-y-z}$, $In_xGa_{1-x}As_yN_zP_{1-y-z}$, $Zn_3P_2$, $Zn_3S_2$, and $ZnP_xS_{1-x}$ (0≤x≤1, 0≤y≤1, 0≤z≤1, 0≤y+z≤1). In yet another embodiment, a $GaAs_yP_{1-y}$ (0≤y≤1) layer is deposited as the second junction structure. In one embodiment, the ohmic contact comprises a tunnel junction or a tunnel junction and a graded composition segment. In yet another embodiment, the nano- or micro-wire are substantially embedded in a wax, glass or polymer. In another embodiment, the embedded nano- or micro-wires are mechanically removed from the Si substrate. In one embodiment, the method further comprises applying a hydrogen evolving and/or oxygen evolving catalyst to the nano- or micro-wire. In a further embodiment, the catalyst is selected from the group consisting of Pt, Co, Cu, Fe, $MoS_x$ where x is nominally 2, but may be sub or super-stoichiometric, Ni, CoMo, CoW, FeMo, NiCo, NiFe, NiFeC, NiFeS, NiMnS, NiMo, NiMoP, NiSn, NiW, NiZn, NiZnP, CoNiFe, NiCoPMo, NiMoCo, NiMoCu, NiMoFe, NiMoW, NiSiMo, NiSiW and NiWPCu. Suitable oxygen evolution catalysts that can be used in the methods and composition of the disclosure can be selected from the group consisting of $IrO_x$ where x is nominally 2, but may be sub or super-stoichiometric, Pt, Co, $Co/(PO_4)^{3-}$, $Co/(BO_3)^{3-}$, CoP, Cu, Fe, Mn, Ni, $Ni/(BO_3)^{3-}$, NiP, Pb, CoFe, $CoPSc_2O_3$, FeMn, NiCo, NiCr, NiCu, NiFe, NiLa, NiLa, $NiPSc_2O_3$, NiSn, NiZn and NiMoFe.

The disclosure also comprises a solar cell comprising the structure of any of the foregoing comprising a micro- or nano-wire of the disclosure.

The disclosure also provides a device or photocell comprising a substrate; an ordered array of elongate semiconductor structures comprising at least 2 different semiconductive materials axially-integrated, wherein the elongate semiconductor structures have length dimensions defined by adjacent ends in electrical contact with at least portions of the substrate and distal ends not in contact with the substrate and have radial dimensions generally normal to the length dimensions and the radial dimensions are less than the length dimensions; and wherein the device absorbs received light and converts it into electricity. In one embodiment, the elongated semiconductor structures comprise wires. In another embodiment, the elongate semiconductor structures are embedded in a matrix. In yet another embodiment, the matrix is a glass, polymer or wax. In one embodiment, the elongate semiconductor structures are partially or fully embedded in a matrix.

BRIEF DESCRIPTION OF THE DRAWINGS

FIG. 3A-C shows a schematic illustration of a procedure used to remove Cu—Si intermetallic region at the tops of the Si microwires. Reactive Ions were directed straight down to the wire growth substrate, causing minimal etching of the oxide-protected side walls. Prior to the reactive ion etch (REI), a PDMS layer was spun down to protect the substrate from etching. All scale bars represent 1 µm. (a) Cu—Si intermetallic region at the top of a Si microwire. (b) Hollow oxide tube at the top of a Si microwire after RIE etch. (c) Top of Si microwire after oxide removal.

FIG. 4A-D shows secondary electron microscopy (SEM) micrographs of GaAs microwire segments axially grown on top of Si microwires. (A) Hallow $SiO_2$ tubes on top of Si microwires created by RIE, the same as structures shown in FIG. 3b. (B) GaAs segments were grown inside the hallow $SiO_2$ tubes in (A) after MOCVD processes. (C)-(D) low- and high-magnification SEM micrographs of GaAs segments axially grown on top of Si microwires. Inset: enlarged view of two GaAs/Si tandem microwires.

DETAILED DESCRIPTION

As used herein and in the appended claims, the singular forms "a," "and," and "the" include plural referents unless the context clearly dictates otherwise. Thus, for example, reference to "a pillar" includes a plurality of such pillars and reference to "the catalyst" includes reference to one or more catalysts known to those skilled in the art, and so forth.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

The publications discussed above and throughout the text are provided solely for their disclosure prior to the filing date of the present application. Nothing herein is to be construed as an admission that the inventors are not entitled to antedate such disclosure by virtue of prior disclosure.

By "about" is meant a quantity, level, value, number, frequency, percentage, dimension, size, amount, weight or length that varies by as much as 30, 25, 20, 25, 10, 9, 8, 7, 6, 5, 4, 3, 2 or 1% to a reference quantity, level, value, number, frequency, percentage, dimension, size, amount, weight or length. With respect to ranges of values, the invention encompasses each intervening value between the upper and lower limits of the range to at least a tenth of the lower limit's unit, unless the context clearly indicates otherwise. Further, the invention encompasses any other stated intervening values. Moreover, the invention also encompasses ranges excluding either or both of the upper and lower limits of the range, unless specifically excluded from the stated range.

The term "array" generally refers to multiple numbers of structures distributed within an area and spaced apart, unless otherwise indicated. Structures within an array all do not have to have the same orientation.

The term "aspect ratio" refers to the ratio of a structure's length to its width. Hence, the aspect ratios of the elongate structures will be greater than one. In various embodiments, the diameter of, for example, a "rod" or "wire" is about 10 nm-50 nm, about 50 nm-100 nm, about 100 nm-500 nm, about 500 nm-1 µm, about 1 µm-10 µm or about 10 µm-100 µm. Typically the diameter will be about 1 µm-10 µm. The length of the "rod" or "wire" is about 1 µm-10 µm, about 10 µm-100 µm, or about 100 µm-several millimeters.

The terms "ball," "spheroid," "blob" and other similar terms may also be used synonymously, except as otherwise indicated. Generally, these terms refer to structures with the width defined by the longest axis of the structure and the length defined by the axis generally normal to the width. Hence, the aspect ratio of such structures will generally be unity or less than unity.

The terms "ordered" or "well-defined" generally refer to the placement of elements in a specified or predetermined pattern where the elements have distinct spatial relationships to one another. Hence, the terms "ordered array" or "well-defined" generally refer to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings. The structures within "ordered" or "well-defined" arrays may also have similar orientations with respect to each other.

A "photovoltaic cell" is an electrical device comprising a semiconductor that converts light or other radiant energy, in the range from ultraviolet to infrared radiation, incident on its surface into electrical energy in the form of power/voltage/current and which has two electrodes, usually a diode with a top electrode and a bottom electrode with opposite electrical polarities. The photovoltaic cell produces direct current which flows through the electrodes. As employed herein, the term photovoltaic cell is generic to cells which convert radiant energy into electrical energy. A solar cell is a photocell that converts light, including solar radiation, incident on its surface into electrical energy. Electromagnetic Radiation to Electric Energy Conversion Device (EREECD) is a device that reacts with electromagnetic (optical) radiation to produce electrical energy. Optoelectronic Energy Device (OED) refers to a device that reacts with optical radiation to produce electrical energy with an electronic device.

A photovoltaic ("PV") cell may be connected in parallel, in series, or a combination thereof with other such cells. A common PV cell is a p-n junction device based on crystalline silicon. In various embodiments of the disclosure a PV cell comprises p-n junction devices of silicon microwires. In other embodiments a PV cell comprises a plurality of silicon p-n junctions. Other types of PV cells can be based on a p-n junction cell of silicon and other semiconductive materials, such as, but not limited to, amorphous silicon, polycrystalline silicon, germanium, organic materials, and Group III-V semiconductor materials, such as gallium arsenide (GaAs).

During operation of a photovoltaic cell, incident solar or light radiation penetrates below a surface of the PV cell and is absorbed. The depth at which the solar radiation penetrates depends upon an absorption coefficient of the cell. In the case of a PV cell based on silicon, an absorption coefficient of silicon varies with wavelength of solar radiation. At a particular depth within the PV cell, absorption of solar radiation produces charge carriers in the form of electron-hole pairs. Electrons flow through one electrode connected to the cell, while holes exit through another electrode connected to the cell. The effect is a flow of an electric current through the cell driven by incident solar radiation. Inefficiencies exist in current solar cells due to the inability to collect/use and convert the entire incident light.

Also, in accordance with a junction design of a PV cell, charge separation of electron-hole pairs is typically confined to a depletion region, which can be limited to a thickness of about 1 µm. Electron-hole pairs that are produced further than a diffusion or drift length from the depletion region typically do not charge separate and, thus, typically do not contribute to the conversion into electrical energy. The depletion region is typically positioned within the PV cell at a particular depth below a surface of the PV cell. The variation of the absorption coefficient of silicon across an incident solar spectrum can impose a compromise with respect to the depth and other characteristics of the depletion region that reduces the efficiency of the PV cell. For example, while a particular depth of the depletion region can be desirable for solar radiation at one wavelength, the same depth can be undesirable for solar radiation at a shorter wavelength. In particular, since the shorter wavelength solar radiation can penetrate below the surface to a lesser degree, electron-hole pairs that are produced can be too far from the depletion region to contribute to an electric current. Multijunction solar cells or tandem cells are solar cells containing several p-n junctions. Each junction can be tuned to a different wavelength of light, reducing one of the largest inherent sources of losses, and thereby increasing efficiency. Traditional single-junction cells have a maximum theoretical efficiency of 34%, a theoretical "infinite-junction" cell would improve this to 87% under highly concentrated sunlight.

N/P junction refers to a connection between a p-type semiconductor and an n-type semiconductor which produces a diode. Depletion region refers to the transition region between an n-type region and a p-type region of an N/P junction where a high electric field exists.

The term "photocatalyst" is meant to refer to any compound in which irradiation of such compound with electromagnetic radiation of visible wavelength will result in the generation of conduction band electrons ($e_{cb}$) and valence band holes ($h^+_{vb}$) that can then undergo oxidation reactions at the catalyst surface with species such as water or other inorganic and organic compounds. Various photocatalyst may be used including platinum, nickel, nickel-molybdenum and the like. For example, transition metals with unfilled d-levels are useful or metals capable of having a stable oxidation state one unit lower or one unit higher, than the host semiconductor. The metal catalyst creates a narrow energy band within the original band gap allowing for the generation of holes in the valence band and electrons in the conduction band, which are required for photocatalytic oxidation/reduction. Suitable transition metals include but are not limited to chromium, iron, nickel, manganese, copper, tungsten, cobalt, molybdenum, ruthenium, vanadium, zinc, silver, platinum, titanium and mixtures thereof.

As used herein, the term "ultraviolet range" refers to a range of wavelengths from about 5 nm to about 400 nm. As used herein, the term "visible range" refers to a range of wavelengths from about 400 nm to about 700 nm. As used herein, the term "infrared range" refers to a range of wavelengths from about 700 nm to about 2 mm. The infrared range includes the "near infrared range," which refers to a range of wavelengths from about 700 nm to about 5 μm, the "middle infrared range," which refers to a range of wavelengths from about 5 μm to about 30 μm, and the "far infrared range," which refers to a range of wavelengths from about 30 μm to about 2 mm.

Within this description, the term "semiconductive material", "semiconductor" or "semiconducting substrate" and the like is generally used to refer to elements, structures, or devices, etc. comprising materials that have semiconductive properties, unless otherwise indicated. Such materials include, but are not limited to: materials including elements from Group IV of the periodic table; materials including elements from Group III and Group V of the periodic table, such as, for example, GaAs, GaP, $GaAs_xP_{1-x}$, $Al_xGa_{1-x}As$, $Al_xGa_{1-x}As_yP_{1-y}$, $In_xGa_{1-x}As$, $In_xGa_{1-x}P$, $In_xGa_{1-x}As_yP_{1-y}$, $Al_xIn_{1-x}As_yP_{1-y}$, $Al_xGa_{1-x}As_yN_zP_{1-y-z}$, $In_xGa_{1-x}As_yN_zP_{1-y-z}$, $Zn_3P_2$, $Zn_3S_2$, and $ZnP_xS_{1-x}$ ($0 \leq x \leq 1$, $0 \leq y \leq 1$, $0 \leq z \leq 1$, $0 \leq y+z \leq 1$); materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials. The term "semiconducting structure" refers to a structure consisting of, at least in part, a semiconducting material. A semiconducting structure may comprise either doped or undoped material. As used herein and throughout the disclosure a semiconductive material (sometimes referred to as photoactive material) can be selected from the group consisting of $TiO_2$, $CaTiO_3$, $SrTiO_3$, $Sr_3Ti_2O_7$, $Sr_4Ti_3O_{10}$, $Rb_2La_2Ti_3O_{10}$, $Cs_2La_2Ti_3O_{10}$, $CsLa_2Ti_2NbO_{13}$, $La_2TiO_5$, $La_2Ti_3O_9$, $La_2Ti_2O_7$, $La_2Ti_2O_7$:Ba, $KaLaZr_{0.3}Ti_{0.7}O_4$, $La_4CaTi_5O_{17}$, $KTiNbO_5$, $Na_2Ti_6O_{13}$, $BaTi_4O_9$, $Gd_2Ti_2O_7$, $Y_2Ti_2O_7$, $ZrO_2$, $K_4Nb_6O_{17}$, $Rb_4Nb_6O_{17}$, $Ca_2Nb_2O_7$, $Sr_2Nb_2O_7$, $Ba_5Nb_4O_{15}$, $NaCa_2Nb_3O_{10}$, $ZnNb_2O_6$, $Cs_2Nb_4O_{11}$, $La_3NbO_7$, $Ta_2O_5$, $KsPrTa_5O_{15}$, $K_3Ta_3Si_2O_{13}$, $K_3Ta_3B_2O_{12}$, $LiTaO_3$, $KTaO_3$, $AgTaO_3$, $KTaO_3$:Zr, $NaTaO_3$:La, $NaTaO_3$:Sr, $Na_2Ta_2O_6$, $CaTa_2O_6$, $SrTa_2O_6$, $NiTa_2O_6$, $Rb_4Ta_6O_{17}$, $Ca_2Ta_2O_7$, $Sr_2Ta_2O_7$. $K_2SrTa_2O_7$, $RbNdTa_2O_7$, $H_2La_{2/3}Ta_2O_7$, $K_2Sr_{1.5}Ta_3O_{10}$, $LiCa_2Ta_3O_{10}$, $KBa_2Ta_3O_{10}$, $Sr_5Ta_4O_{15}$, $Ba_2Ta_4O_{15}$, $H_{1.8}Sr_{0.81}Bi_{0.19}Ta_2O_7$, Mg—Ta Oxide, $LaTaO_4$, $LaTaO_7$, $PbWO_4$, $RbWNbO_6$, $RbWTaO_6$, $CeO_2$:Sr, $BaCeO_3$, $NaInO_2$, $CaIn_2O_4$, $SrIn_2O_4$, $LaInO_3$, $Y_xIn_{2-x}O_3$, $NaSbO_3$, $CaSb_2O_6$, $Ca_2Sb_2O_7$, $Sr_2Sb_2O_7$, $Sr_2SnO_4$, $ZnGa_2O_4$, $Zn_2GeO_4$, $LiInGeO_4$, $Ga_2O_3^b$, $Ga_2O_3$:$Zn^c$, $Na_2Ti_3O_7$, $K_2Ti_2O_5$, $K_2Ti_4O_9$, $Cs_2Ti_2O_5$, $H^+$—$Cs_2Ti_2O_5$, $Cs_2Ti_5O_{11}$, $Cs_2Ti_6O_{13}$, $H^+$—$CsTiNbO_5$, $H^+$—$CsTi_2NbO_7$, $SiO_2$-pillared $K_2Ti_4O_9$, $SiO_2$-pillared $K_2Ti_{2.7}Mn_{0.3}O_7$, $Na_2W_4O_{13}$, $H^+$—$KLaNb_2O_7$, $H^+$—$RbLaNb_2O_7$, $H^+$—$CsLaNb_2O_7$, $H^+$—$KCa_2Nb_3O_{10}$, $SiO_2$-pillared $KCa_2Nb_3O_{10}$, ex-$Ca_2Nb_3O_{10}$/$K^+$ nanosheet[4)], Restacked ex-$Ca_2Nb_3O_{10}$/$Na^+$, $H^+$—$RbCa_2Nb_3O_{10}$, $H^+$—$CsCa_2Nb_3O_{10}$, $H^+$—$KSr_2Nb_3O_{10}$, $H^+$—$KCa_2NaNb_4O_{13}$. $Bi_2W_2O_9$, $Bi_2Mo_2O_9$, $Bi_4Ti_3O_{12}$, $BaBi_4Ti_4O_{15}$, $Bi_3TiNbO_9$, $PbMoO_4$, $(NaBi)_{0.5}MoO_4$, $(AgBi)_{0.5}MoO_4$, $(NaBi)_{0.5}WO_4$, $(AgBi)_{0.5}WO_4$, $Ga_{1.14}In_{0.86}O_3$, β-$Ga_2O_3$, $Ti_{1.5}Zr_{1.5}(PO_4)_4$, $WO_3$, $Bi_2WO_6$, $Bi_2MoO_6$, $Bi_2MO_3O_{12}$, $Zn_3V_2O_8$, $Na_{0.5}Bi_{1.5}VMoO_8$, $In_2O_3$ $(ZnO)_3$, $SrTiO_3$:Cr/Sb, $SrTiO_3$:Ni/Ta, $SrTiO_3$:Cr/Ta, $SrTiO_3$:Rh, $CaTiO_3$:Rh, $La_2Ti_2O_7$:Cr, $La_2Ti_2O_7$:Fe, $TiO_2$:Cr/Sb, $TiO_2$:Ni/Nb, $TiO_2$:Rh/Sb, $PbMoO_4$:Cr, $RbPb_2Nb_3O_{10}$, $PbBi_2Nb_2O_9$, $BiVO_4$, $BiCu_2VO_6$, $BiZn_2VO_6$, $SnMo_2O_6$, $AgNbO_3$, $Ag_3VO_4$, $AgLi_{1/3}Ti_{2/3}O_2$, $AgLi_{1/3}Sn_{2/3}O_2$, $LaTiO_2N$, $Ca_{0.25}La_{0.75}TiO_{2.25}N_{0.75}$, TaON, $Ta_3N_5$, $CaNbO_2N$, $CaTaO_2N$, $SrTaO_2N$, $BaTaO_2N$, $LaTaO_2N$, $Y_2Ta_2O_5N_2$, $TiN_xO_yF_z$, $Sm_2Ti_2O_5S_2$ and La—In oxysulfide.

Further the term "vertical" with reference to wires, rods, whiskers, pillars, etc., generally refers to structures that have a length direction that is elevated somewhat from horizontal.

The term "vertical alignment" generally refers to an alignment or orientation of a structure or structures that is elevated from horizontal. The structure or structures do not have to be completely normal to horizontal to be considered to have a vertical alignment.

The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal.

The term "wider band-gap" refers to the difference in band-gaps between a first material and a second material. "Band-gap" or "energy band gap" refers to the characteristic energy profile of a semiconductor that determines its electrical performance, current and voltage output, which is the difference in energy between the valence band maximum and the conduction band minimum. For example, in one embodiment, reference to a wire having a first junction with a "wider band-gap material" refers to a material having a wider band-gap than a second junction of a different material.

Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure.

The term "p-i-n junction" as used herein means an assembly comprising three semiconducting materials layers in contact with one another, where one layer is p-doped, a second layer is n-doped, and the third layer is an intrinsic semiconductor layer ("i-layer"), where the i-layer is disposed between the p-layer and the n-layer. Each layer can be doped as is understood by one skilled in the art in view of the semiconducting content of each layer. The term "intrinsic" as used herein means a material in which the concentration of charge carriers is characteristic of the material itself rather than the content of impurities (or dopants). A "heterojunction p-n junction" as used herein is a p-i-n junction as defined herein wherein the two semiconducting materials comprising the p-layer and n-layer, respectively, have different alloy composition (notwithstanding the doping content of the layers); the i-layer may comprise the same or a different alloy with respect to the p-layer and/or n-layer.

Embodiments of the disclosure comprise nano- and/or micro-wires comprising a plurality of p-n junctions. In one embodiment, a microwire of the disclosure comprises at least one, two, three, four or more p-n junctions. In another embodiment, the microwire comprises 3 or more p-n junctions. A multijunction (sometimes referred to as a tandem junction) device consisting of at least one Si microwire array and another photopotential generating junction connected intimately and electrically in series to improve efficiency and the maximum photopotential, i.e. $V_{oc}$, will be increase. This is important for photoelectrosynthetic systems, where the energy in sunlight is directly converted into chemical fuel. For example, in some instances potentials larger than the $V_{oc}$ of a single Si microwire array are required, e.g. $H_2/Br^{3-}$ from HBr; $H_2/Cl_2$ from HCl; $H_2/O_2$ from $H_2O$.

In one embodiment, the disclosure provides a axially-integrated tandem wire array, wherein a plurality of wires in the array comprise a crystalline Si (c-Si) bottom junction and an integrated top junction. This may be considered as having a first wire comprising a first semiconductive material ("bottom junction") and a second wire axially integrated with the first wire comprising a second semiconductive material ("top junction"). In some embodiments, the bottom and top junctions are separated by an ohmic contact. The bottom junction can comprise a crystalline Si material that comprises a radial p-n, radial p-i-n, or axial p-n or p-i-n. The top junction can be a radial p-n junction, a radial p-i-n junction, an axial p-n junction, or an axial p-i-n junction. The semiconductive materials of the top and bottom junctions can be the same or different.

Figure 1:
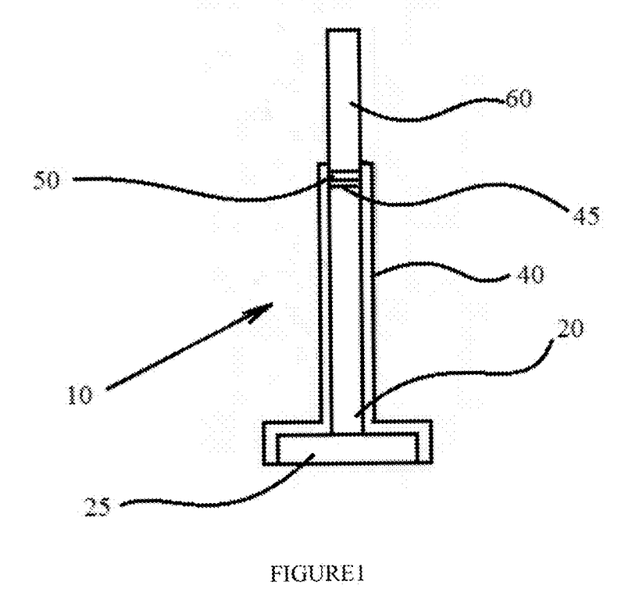
FIG. 1 shows a schematic of an axially-integrated epitaxially-grown tandem wire light absorber.

For example, FIG. 1 depicts a schematic of an axially-integrated epitaxially-grown tandem wire of the disclosure. The epitaxial tandem wire (10), comprises a first bottom junction (20) comprising, for example, a first semiconductive nano- or micro-wire having an aspect ratio of greater than 1. In one embodiment, the first semiconductive nano- or micro-wire can comprise Si. The wire can be grown from a substrate (25) (as described more thoroughly below), which may be removed, depending upon the ultimate use of an array of such axial-integrated epitaxial-tandem wires. A passivation layer (40) can be applied to the first nano- or micro-wire to encapsulate the first semiconductive nano- or micro-wire. The passivation layer (40) can comprise, for example, $SiO_2$, $Si_3N_4$, $SiO_xN_y$, or amorphous Si. Using an etching technique the surface tip (45) of the nano- or micro-wire can be exposed and an ohmic contact (50) can, optionally, be applied. The ohmic contact (50) comprises a second semiconductive material such as, for example, GaAs, GaP, $GaAs_xP_{1-x}$, $Al_xGa_{1-x}$, As, $Al_xGa_{1-x}As_yP_{1-y}$, $In_xGa_{1-x}As$, $In_xGa_{1-x}P$, $In_xGa_{1-x}As_yP_{1-y}$, $Al_xIn_{1-x}As_yP_{1-y}$, $Al_xGa_{1-x}As_yN_zP_{1-y-z}$, $In_xGa_{1-x}As_yN_zP_{1-y-z}$, $Zn_3P_2$, $Zn_3S_2$, and $ZnP_xS_{1-x}$ ($0 \le x \le 1$, $0 \le y \le 1$, $0 \le z \le 1$, $0 \le y+z \le 1$) and the like. The ohmic contact (50) can comprise, for example, a graded composition segment and a tunnel junction (degenerated p-type and n-type doping with abrupt interfaces). For example, the tunnel junction can comprise degenerate doped $n^{++}$-$GaAs_xP_{1-x}/p^{++}$-$GaAs_xP_{1-x}$ where $0 \le x \le 1$. A top junction (60) comprising the second or a third semiconductive material is then grown directly on the first bottom junction (20) or on the ohmic contact (50). The top junction (60) can be a nano- or micro-wire having an aspect ratio of greater than 1. The top junction (60) can be made of the same or different semiconductive material compared to the ohmic contact (50). For example, the top junction can comprise a semiconductive material selected from the group consisting of GaAs, GaP, $GaAs_xP_{1-x}$, $Al_xGa_{1-x}$, As, $Al_xGa_{1-x}As_yP_{1-y}$, $In_xGa_{1-x}As$, $In_xGa_{1-x}P$, $In_xGa_{1-x}As_yP_{1-y}$, $Al_xIn_{1-x}As_yP_{1-y}$, $Al_xGa_{1-x}As_yN_zP_{1-y-z}$, $In_xGa_{1-x}As_yN_zP_{1-y-z}$, $Zn_3P_2$, $Zn_3S_2$, and $ZnP_xS_{1-x}$ ($0 \le x \le 1$, $0 \le y \le 1$, $0 \le z \le 1$, $0 \le y+z \le 1$) and any of the semiconductive materials set forth elsewhere herein. Furthermore, it should be recognized that any p-type doped regions of the semiconductive material for any portion of the device schematically presented in FIGS. 1 and 2 could be changed to n-type and vice versa.

Figure 2A:
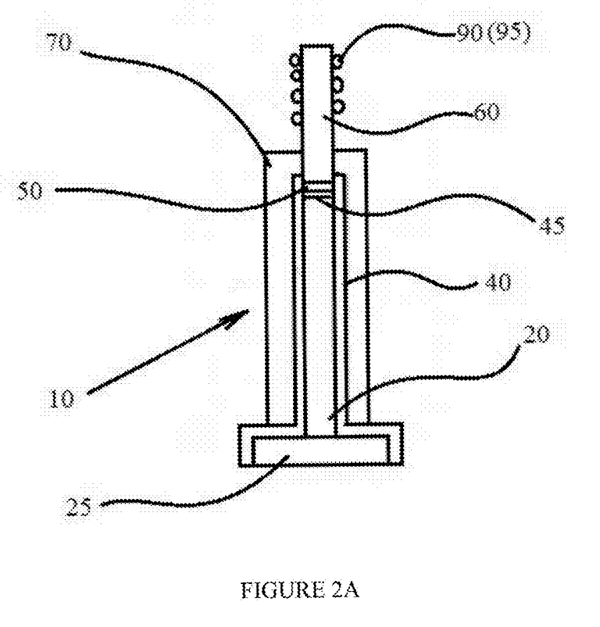
FIG. 2A-B shows an example of water splitting devices based on the axially-integrated tandem wire array light absorbers: (a) as-grown on substrate and (b) after peel-off.
Figure 2B:
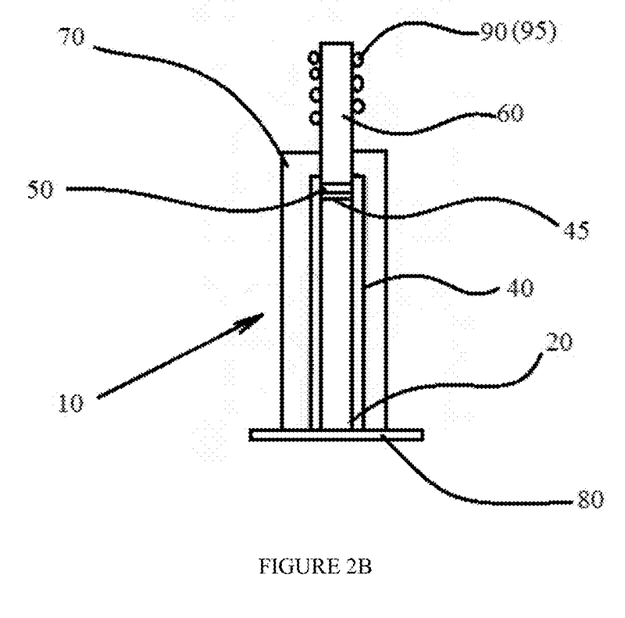

Referring to FIG. 2A, the nano- or micro-wire array can be embedded in a glass, polymer wax or other material to embed or form a membrane (70) (e.g., Nafion®). Once embedded the wire array can be mechanically peeled from the substrate (25) to make a free-standing device (see, e.g., FIG. 2B). As shown in FIG. 2, the as-grown wire arrays can be subsequently in-filled with a polymer or other material and the catalyst particles can be deposited on the front and back side of the device. Alternatively, this device could be mechanically peeled from the substrate to make a free-standing water splitting device. A conductive backing or reflective material such as ITO (80) can be deposited on the surface exposed upon removal of the substrate (25). In yet another embodiment, a catalyst (90) such as a hydrogen or oxygen evolution catalyst can be coated on the device to facilitate, for example, $H_2$ production from $H_2O$. The catalyst can be any number of catalysts useful as hydrogen or oxygen evolution. For example, suitable hydrogen evolution catalyst can be selected from the group consisting of Pt, Co, Cu, Fe, $MoS_x$ where x is nominally 2, but may be sub or super-stoichiometric, Ni, CoMo, CoW, FeMo, NiCo, NiFe, NiFeC, NiFeS, NiMnS, NiMo, NiMoP, NiSn, NiW, NiZn, NiZnP, CoNiFe, NiCoPMo, NiMoCo, NiMoCu, NiMoFe, NiMoW, NiSiMo, NiSiW and NiWPCu. Suitable oxygen evolution catalysts that can be used in the methods and composition of the disclosure can be selected from the group consisting of $IrO_x$ where x is nominally 2, but may be sub or super-stoichiometric, Pt, Co, Co/$(PO_4)^{3-}$, Co/$(BO_3)^{3-}$, CoP, Cu, Fe, Mn, Ni, Ni/$(BO_3)^{3-}$, NiP, Pb, CoFe, $CoPSc_2O_3$, FeMn, NiCo, NiCr, NiCu, NiFe, NiLa, NiLa, $NiPSc_2O_3$, NiSn, NiZn and NiMoFe. For example, the top junction 60 can be coated with a hydrogen reduction catalyst 95 such as Pt, or other catalysts that are needed to produce the desired fuels.

Such wire arrays or structures comprise, in one embodiment, crystalline Si wires of a length long enough to absorb sunlight fully, each wire with a radius matched to its diffusion length, and the wires being regularly spaced, and oriented predominantly vertically, typically over large areas.

The disclosure also provides a method of making the axially-integrated epitaxial tandem wire arrays of the disclosure. Embodiments of the disclosure can comprise growing the first junction of the wire arrays or structures through VLS processes. In such an embodiment, a templating layer is first patterned with openings (e.g., an array of holes) in which the wires or structures are to be grown. The templating layer comprises a diffusion barrier for a deposited catalyst. The diffusion barrier may comprise a patterned oxide layer, a patterned insulating layer, such as a layer comprising silicon nitride, a patterned metal layer, or combinations of these materials or other materials or processes that facilitate the deposition of the catalyst for semiconductor structure growth. The catalyst is then deposited in the openings. Wires or structures are then grown on the substrate by heating the substrate and applying a growth gas.

In one embodiment, a Si <111> wafer is used as the material from which the wire arrays are grown. Other materials may also be used to support wire growth, such as a thin Si layer disposed on glass, or other such Si substrates. All or portions of the wafer may be doped. For example, some embodiments may use a degenerately doped n-type Si wafer. In the process of a surface oxide layer is thermally gown on the wafer. In one embodiment, the surface oxide layer is grown to a thickness of 285 nm. In another embodiment, the surface oxide layer is grown to a thickness of 300 nm. Other embodiments may comprise oxide layers at other thicknesses. Still other embodiments have the oxide layer deposited via chemical vapor deposition (CVD) or other methods known in the art.

A photoresist layer is applied to support the development of a patterned template as discussed below. However, other materials and techniques for creating a patterned template may be used, such as a latex layer, or stamping or soft lithography. The photoresist layer may comprise S1813 photoresist from MicroChem Corp. (Newton, Mass., USA) or other photoresist material. The photoresist layer is then exposed to a desired array pattern and developed with a developer to form a desired pattern of holes in the resist layer. The developer may comprise MF-319 or other developers known in the art. The patterned resist layer is then used to etch the oxide layer on the Si wafer. Etching of the oxide layer may be achieved by using hydrofluoric acid compositions such as buffered HF (9% HF, 32% $NH_4F$) from Transene Company, Inc. (Danvers, Mass., USA). Other etching techniques known in the art may also be used to etch the oxide layer. The result of the etching will be a pattern of holes in the oxide layer. A pattern of holes may be, for example, a square array of 3 μm diameter holes that are 7 μm center to center.

A growth catalyst is then thermally evaporated onto the resist layer and into the holes in the oxide layer. Other methods of depositing the catalyst may be used, such as electrodeposition. Typical catalysts comprise gold, copper, or nickel, but other metals known in the art as Si V-L-S catalysts may be used, such as platinum or aluminum. For example, 500 nm of gold may be thermally evaporated onto the resist layer and into the holes. Lift-off of the photoresist layer is then performed, leaving catalyst islands separated by the oxide in the oxide layer.

The wafer with the patterned oxide layer and the deposited catalyst may then be annealed. Typically, the annealing is performed in a tube furnace at a temperature between 900 to 1000° C. or at a temperature of about 1050° C. for 20 minutes with the application of 1 atm of $H_2$ at a flow rate of 1000 sccm (where SCCM denotes cubic centimeters per minute at STP). Growth of wires on the wafer is then performed. Typically, the wires are grown in a mixture of $H_2$ (1000 sccm) and $SiCl_4$ (20 sccm) at about 1 atm. In one embodiment, the wires are grown for between 20 to 30 minutes at temperatures between 850° C. to 1100° C. Other embodiments may use different growth times, pressures, and or flow rates. However, optimal growth temperatures are between 1000° C. and 1050° C. Growth for these times and at these temperatures may produce wires from 10 μm to 30 μm in length or longer.

Following the growth of the wires, the oxide layer is removed. The oxide layer may be removed by etching the wafer for 10 seconds in 10% HF (aq) or other methods known in the art may be used to remove the oxide layer. Growth catalyst particles may remain at the top of each grown wire, which may impact the functionality of the resulting wire array. Therefore, it may be advantageous to remove the catalyst particles. For example, if the catalyst comprises Au, the gold particles may be removed by soaking the wafer 10 for 10 min in a TFA solution from Transene Company, Inc., which contains $I^-/I_3^-$. Other methods known in the art may also be used to remove catalyst particles.

According to an embodiment of the disclosure, photolithography is a suitable method for enabling uniform arrays of wires of diameters of ~1 μm to be grown over large areas. In cost sensitive applications such as photovoltaics, it may be desirable to employ lower-cost lithographic methods, and embodiments of the disclosure are readily extendable to alternative patterning techniques such as nanoimprint lithography.

Cost also motivates the use of non-Au catalysts for embodiments according to the disclosure. As indicated above, Cu, Ni, Pt, or Al may be used as a catalyst for Si wire growth. Cu is, unlike Au, an inexpensive, earth-abundant material, and, therefore, of particular interest for such embodiments. Although Cu is more soluble in Si than Au and is also a deep trap, Si solar cells are more tolerant of Cu contamination than of Au, and thus diffusion lengths of at least microns even in the case of Cu catalyzed growth can be expected.

The method described above has been shown to produce nearly defect-free arrays that exhibited an extremely narrow diameter and length distribution, and highly controlled wire position.

As discussed above, other growth catalysts may be used to facilitate the growth of the Si wires in the wire array. Nominally identical wire arrays may be obtained when Cu, Ni, Pt, or Al (or other Si growth catalyst metals) are used as the VLS growth catalyst instead of Au.

Use of the oxide layer is particularly useful in some embodiments of the disclosure. For example, Si wire arrays did not yield high pattern fidelity when the catalyst was not confined using the patterned oxide layer as described above.

The as-grown wires are then encapsulated with thermally-grown or deposited $SiO_2$, $Si_3N_4$, $SiO_xN_y$ or amorphous Si. An anisotropic etching technique (e.g., reactive-ion etching) is used to expose the very top of encapsulated Si wires. If any region is damaged by ion bombardment it can be removed by Si chemical etching. An axial p-n or p-i-n junction can be fabricated by forming a think P+ emitter layer through dopant diffusional drive-in. Only the top of a Si wire is exposed, while the rest of the Si wire is encapsulated by the surface passivation layer.

An ohmic contact region and an axially integrated top junction is then grown on top of each individual wire top exposed by the method above. The growth can be carried out, for example, by a metal-organic chemical vapor deposition (MOCVD) system. For example, a composition graded GaAsP layer can be deposited before the growth of $GaAs_yP_{1-y}$ ($0 \leq y \leq 1$) to allow wires to realize lattice matching. GaAsP wires with large lattice mismatch could also be grown on small diameter Si wires.

In yet another embodiment, a degenerate $Al_zGa_zAs_yP_{1-y}$/$GaAs_yP_{1-y}$ ($0 \leq y \leq 1$; $0 \leq z \leq 1$) window layer can be conformally deposited right after the top junction growth. This creates a surrounding emitter for the top junction.

Upon generation of the micro- and/or nano-wire semiconductor array, a photocatalyst can optionally be deposited onto the wires. In one embodiment, an electrocatalyst bath is prepared comprising a metal salt, where the metal component becomes the bulk of the active catalyst and the salt ion acts as a chelating and solubilizing agent. Stabilizers can be added to the bath and the pH adjusted. For example, in one embodiment, electrocatalyst plating baths comprise a Nickel(II) sulfamate salt, where the Ni component becomes the bulk of the active catalyst and the sulfamate ion acts as a chelating and solubilizing agent. To the solution of Ni(II) is added a small quantity of boric acid as a stabilizer, and the pH is adjusted using sulfamic acid or sodium hydroxide. Optionally, a small amount of molybdenum in the form of sodium molybdate ($Na_2MoO_4$) is added. Addition of the latter results in improved catalytic activity for the resultant coating toward the hydrogen evolution reaction (HER), due to the formation of a high surface-area alloy of Ni and Mo on the electrode.

The micro- and/or nano-wire semiconductive array (or portion thereof) is immersed in the bath comprising the catalyst to be coated on the substrate. The substrate is then electroplated with the metal catalyst. The electrolytic plating technique comprises placing the photoelectrode on which the catalyst is to be plated into the bath described above, along with a suitable auxiliary electrode (e.g., Ni foil), where upon either a constant voltage (potentiostatic) or constant current (galvanostatic) is applied, using a potentiostat or another available current/voltage source. The magnitude of current that passes between the electrode of interest and the auxiliary electrode should preferably be between about 1 and 100 mA (e.g., 5, 10, 20, 25, 30, 35, 40, 45, 50, 55, 60, 65, 70, 75, 80, 85, 90 or 95 mA) of cathodic current for every $cm^2$ of macroscopic surface area for the electrode of interest. Also important is that the photoelectrode must be illuminated with a sufficient photon flux to permit all of the current that flows between its surface and the electrolytic plating solution to be resultant from excited charge carriers generated by the illumination.

Embodiments of the disclosure provide structures that are particularly useful for devices such as solar cells, electronic devices, photonic materials that utilize optical properties of periodic structures of light-absorbing or light-directing materials arranged with structural order in another optically different material, sensors, and similar chemical, optical, and electronic devices and structures.

Embodiments of the disclosure comprise wire arrays or other semiconducting structures with control of the size, position, and uniformity of the fabricated wire arrays or structures over a relatively wide area wherein the arrays comprise wires having tandem or multijunction modes. Such wire arrays or structures can comprise crystalline Si wires of a length long enough to absorb sunlight fully, each wire with a radius matched to its diffusion length, and the wires being regularly spaced, and oriented predominantly vertically, typically over large areas. As mentioned above, the dimensions of the underlying wire arrays are typically from about 1-10 μm in diameter and 10-100 μm or greater in length. Embodiments of the disclosure may comprise growing the wire arrays or structures through VLS processes.

In one embodiment, the ordered array of rods/wires is layered, etched, and a second junction of a different material grown on the first bottom junction. The ordered array of rods/wires can then be embedded in a matrix material (e.g., glass, wax or a polymer). The array can be embedded to substantially cover the whole length of the wires (e.g., 1-100% of the length), or may be only partially embedded (e.g., 99% or less). The matrix can be useful for removing the array of wires from a substrate. In another embodiment, the array of wires is first processed to provide a p-n junction with, for example, a p-emitter layer on an n-type crystalline microwire prior to embedding the wire array in the matrix material.

Thus, in one embodiment the disclosure provides an array of rods/wires comprising Si having dimensions of about 1-10 micrometers in diameter and about 1 micrometer to about 1 mm in length and a second semi-conductive wire axially-integrated to the Si wire. In some embodiments, the array of rods/wires is generated on a substrate. In other embodiments, the array is coated or treated to provide multiple junctions and then removed from the substrate. In yet another embodiment, the array is coated or treated to provide multiple junctions and then the rods/wires are embedded in a polymer material to maintain organization upon removal of the array from a substrate.

A particular application for wire arrays fabricated according to embodiments of the disclosure is for the use of such wire arrays in photo cells or fuel generating systems. Device analysis has shown that photovoltaic efficiency is maximized in wire arrays when the mean radius of the wires is comparable to the minority carrier diffusion length. This is because of a trade-off between increased current collection and the loss of open-circuit voltage due to the increased junction and surface area.

Hence, embodiments of the disclosure provide wire arrays with aspect ratios particularly suitable for use in solar cell apparatus. Further, embodiments of the disclosure provide for the ability to have relatively dense arrays of wires, further improving the ability of devices using such arrays to convert light to electrical energy.

The disclosure also provides an artificial photosynthetic system that utilizes sunlight and water, or other solutions that can be used to generate $H_2$, gas as inputs and produces hydrogen and, for example, oxygen as the outputs. The system comprises three distinct primary components: a photoanode, a photocathode, and a product-separating but ion-conducting membrane. These components may be fabricated and optimized separately before assembly into a complete water-splitting system. The system may incorporate two separate, photosensitive semiconductor/liquid junctions that collectively generate the 1.7-1.9 V at open circuit necessary to support both the net oxidation and reduction of, for example, water to $O_2$ and $H_2$, respectively.

The photoanode and photocathode may comprise arrays of semiconductive microwire structures of the disclosure comprising a metal catalyst on a first and/or second junction of a wire of the disclosure, as described above. The catalysts disposed on the semiconductive structures are used to drive the oxidation or reduction reactions at low overpotentials. Typically the catalyst coated on the semiconducting structures/substrates do not block or inhibit light energy from contacting the semiconducting wire array or substrate. Accordingly, the catalyst should cover from about 1-99% of the surface area unless sufficiently transparent to allow light penetration to the underlying semiconducting substrate. The high aspect-ratio semiconductor rod/wire electrodes allow for the use of low cost, earth abundant materials without sacrificing energy conversion efficiency due to the orthogonalization of light absorption and charge-carrier collection. Additionally, the high surface-area design of the wire-based semiconductor array electrode inherently lowers the flux of charge carriers over the rod array surface relative to the projected geometric surface of the photoelectrode, thus lowering the photocurrent density at the solid/liquid junction and thereby relaxing the demands on the activity (and cost) of the electrocatalysts. A flexible composite polymer film may be used to allow for electron and ion conduction between the photoanode and photocathode while simultaneously preventing mixing of the gaseous products. That is, the rod/wire arrays may be embedded in flexible, polymeric membrane materials, allowing the possibility of roll-to-roll system assembly. Separate polymeric materials may be used to make electrical contact between the anode and cathode, and also to provide structural support. Interspersed patches of an ion conducting polymer may be used to maintain charge balance between the two half-cells.

In a particular embodiment, the photocathode may comprise vertically (or near vertically) aligned rod/wire arrays made of macroporous p-Si <100> with a resistivity of 13-15 Ωcm and a second top junction in tandem with the microwire array.

In another embodiment, the photoanode and photocathode components may be electrically, and ionically, interconnected through, but physically separated by, a flexible composite polymer film. Further, multi-component membranes, composed of polymeric materials, that exhibit desired mechanical pliability, electronic conductivity, and ion permeability properties for a feasible water electrolysis system may be used. Specifically, polypyrrole may be used to make electrical contact between the anode and cathode, while poly(dimethylsiloxane) (PDMS) may be used to provide structural support for the semiconductor rod/wire arrays. For proton conduction in a cell operated under acidic conditions, Nafion® may be employed, whereas vinylbenzyl chloride modified films of poly(ethylene-co-tetrafluoroethylene) (ETFE) may be used for hydroxide conduction in a cell operated under alkaline conditions.

The following examples are meant to illustrate, not limit, the disclosed invention.

EXAMPLES

One instance of the detailed fabrication processes can be described as follows: First, vertical, lithography-defined Si microwires are grown on Si substrates using $SiCl_4$ precursors. Then, a radial p-n junction, or a radial p-i-n junction or an axial p-n junction can be fabricated by doping during growth and/or through dopant diffusional driving-in.

To fabricate an axial p-n or p-i-n junction, the as-grown Si wires can be grown with n-type doping, or without intentional doping and with subsequent boron drive-in to fabricate a p+ emitter layer. For example, arrays of phosphorous-doped Si microwire arrays with a donor density, $N_D=3\times10^{17}$ cm$^{-3}$, were grown via a Cu-catalyzed vapor-liquid-solid (VLS) process using As-doped n$^+$-Si wafers (<0.005 Ω-cm, Addison) as substrates. The n$^+$-Si growth wafers were received with a 400 nm thick thermal oxide ($SiO_2$) that had been patterned to produce 3 μm diameter holes filled with Cu on a 7 μm pitch. The Si microwire arrays were grown for 9 minutes in a chemical-vapor deposition (CVD) furnace at atmospheric pressure using $SiCl_4$ (Strem, 99.9999+%) at a 25 sccm flow rate, $H_2$ (Matheson, research grade) at a 500 sccm flow rate, and $PH_3$ (Matheson, 100 ppm in $H_2$) at a 0.3 sccm flow rate. This process produced n-Si microwires that were 40-80 μm in length, had a diameter of ~2 μm, and had doping densities on the order of $10^{17}$ cm$^{-3}$. After growth, the samples were cooled to ~200° C. under a 500 sccm flow of He. Without flowing $PH_3$, intrinsic wires without intentional doping are grown. Then, the Si wires are encapsulated with thermally-grown or deposited $SiO_2$, $Si_3N_4$, $SiO_xN_y$, or amorphous Si. To protect the sidewalls and passivate the surfaces of Si microwires, a 200 nm thermal oxide was conformally grown on the Si microwires by flowing 4 sccm of $O_2$ gas at 1100° C. for 2.5 h over the sample.

To remove the VLS catalysts after growth, elemental Cu can be removed from the microwires by using a 5:1:1 (by volume) solution of $H_2O:HCl:H_2O_2$ at 75° C. (RCA-2 etch) for 10 min. The microwires are then exposed twice for ~10 s to a 10:1 solution of $H_2O:HF$ (dilute hydrofluoric acid etch) prior to removal of the Cu. For the dilute hydrofluoric acid (HF) etch, the microwires are contained in a Petri dish at room temperature and the etching solution is pipetted onto the microwire array sample. For the RCA-2 etch, samples are placed in test tubes immersed in a water bath at 75° C. that contained approximately 6 mL of etch solution. After the wet etches, samples are rinsed with deionized $H_2O$ and dried under $N_2$. Other VLS catalysts, such as Au or Al can be removed according to their etching chemistry.

Figure 3A:
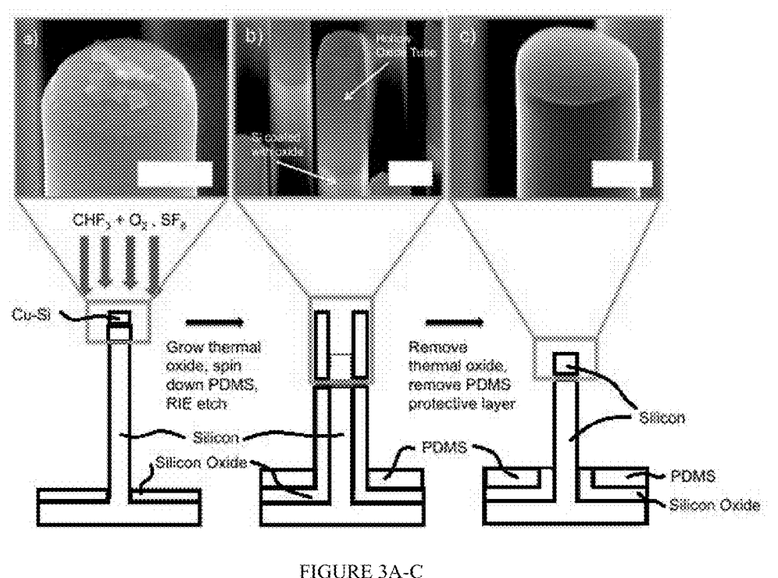

Many VLS catalysts form intermetallic phases with the as-grown semiconductors, in this case, Si. For example, Cu catalysts will form a Cu—Si intermetallic region between the elemental Cu catalysts and the as-grown Si microwires (shown in FIG. 3a). Therefore, an anisotropic etching technique (e.g., reactive-ion etching) will be employed to expose the very top of $SiO_2$-encapsulated or passivated Si microwires. Before the intermetallic region is removed by reactive-ion etching, a 5:1:0.1 mixture of toluene, polydimethylsiloxane (PDMS) and Sylgard 184 initiator is spun down around the base of the microwires, so that the substrate surfaces in the vicinity of Si microwires will not be damaged by ion bombardment. The etching comprises etching the oxide layer on the top of the microwires at a power of 80 W for 10 min, using a mixture of $CHF_3$ at a flow rate of 20 sccm and $O_2$ at a flow rate of 2 sccm with a total pressure of 20 mTorr. Then, the Cu—Si intermetallic region was etched at a power of 80 W for 60 min, using $SF_6$ at a flow rate of 80 sccm with a total pressure of 26 mTorr.

The reactive ion etching (RIE) step can be used to remove as much as 5-10 μm of Si from the tops of the microwires. In the etching, ionized gas molecules uniaxially impinge on the sample and etch materials at different rates due to the disparate etching chemistry. Consequently, a tubular structure of hollow $SiO_2$ is formed at the top of the microwire, because $SF_6$ etches Si at a faster rate than $SiO_2$ (FIG. 3b). To confirm that several microns were removed from the tops of the microwires, the oxide layer around the sides of the microwires was removed by HF etching. Within the resolution of the scanning-electron micrographs (~500 Å), the RIE resulted in a flat Si surface at the top of the microwire, as shown in FIG. 3c. In the wire processing, the oxide layer should not be removed before subsequent growth of the top junction. The oxide layer also ensured that the sides were protected from damage due to ion bombardment. The ~500 Å of top region may suffer from the fluorine and sulfur contamination and bombardment caused by $SF_6$ ions, and the damaged Si region can be removed by Si-specific wet chemical etching (e.g., 1 molar potassium hydroxide, KOH). To remove the PDMS, the samples were immersed in a 3:1 solution of n-methyl-2-pyrrolidone:tetra-n-butylammonium fluoride.

An axial p-n or p-i-n junction as the bottom junction (20) can be fabricated by forming a thin p+ emitter layer through dopant diffusional drive-in. For example, gas phase boron drive-in can be realized by flowing a mixture of $BCl_3$ and $H_2$ at ~950 to 1200° C. An axial junction will be formed because only the top of a Si microwire is exposed, while the rest of the Si microwire is encapsulated by the layer (40).

Figure 4A:
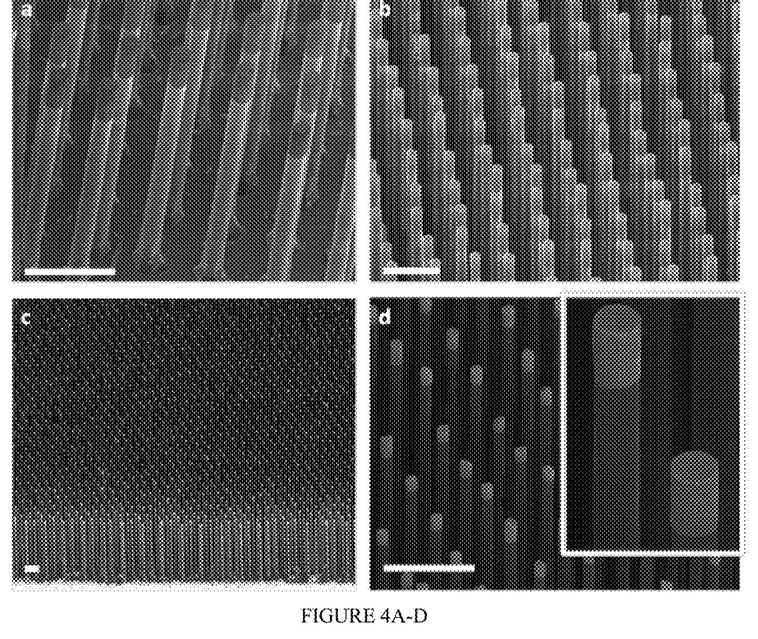

An Ohmic contact region (50) and an axially integrated top junction (60) can be grown in the hallow $SiO_2$ tube on the top of each Si microwire (FIG. 4a). The growth can be carried out in a metal-organic chemical vapor deposition (MOCVD) system. FIG. 4b-4d shows an example of GaAs microwire segments axially grown on top of Si microwires. FIG. 4b shows that the hallow $SiO_2$ tubes can serve as templates for growth of GaAs microwire segments. The duration of MOCVD process can be extended for increased length of GaAs segments. Given enough time for growth, the GaAs segments will extend out of the hallow $SiO_2$ tube. To clearly show the as-grown GaAs microwire segments, the sample in FIG. 4b were immersed in buffered HF to remove the hallow $SiO_2$ tube and the $SiO_2$ shell. Therefore, the GaAs segments that were buried in the hallow $SiO_2$ tubes were exposed. As shown in FIGS. 4c and 4d, the bright contrast regions are GaAs microwire segments, whereas the dark contrast regions are Si microwires. Such a GaAs/Si tandem microwire structure can serve as an axially-integrated epitaxially-grown tandem wire light absorber as illustrated in FIG. 1.

A tunnel junction for Ohmic contact between the top and the bottom junctions can also be fabricated by the MOCVD process. The tunnel junction consists of degenerately-doped $n^{++}$-GaAs$_x$P$_{1-x}$/$p^{++}$-GaAs$_x$P$_{1-x}$ ($0<=x<=1$). Then, a composition graded GaAsP layer can be deposited before the growth of GaAs$_y$P$_{1-y}$ ($0<=y<=1$) alloy wires to realize lattice matching. GaAs$_x$P$_{1-x}$ wire segments with large lattice mismatch could also be grown on Si microwires, as demonstrated for GaAs.

A degenerate-doped Al$_z$Ga$_z$As$_y$P$_{1-y}$/GaAs$_y$P$_{1-y}$ ($0<=y<=1$; $0<=z<=1$) window layer can be conformally deposited right after growth of the top junction. This will create a surrounding emitter for the top junction. The doping polarity of the p-doped emitter regions and the n-doped base regions could be swapped.

To fabricate a water-splitting device, the axial tandem wire arrays will be infilled with Nafion®; and the electrocatalysts will be electroless deposited or electrodeposited on the front and back side of the device, as shown in FIG. 2A-B. Alternatively, this device can be mechanically peeled from the substrate to make a free-standing, flexible water-splitting device.

Although a number of embodiments and features have been described above, it will be understood by those skilled in the art that modifications and variations of the described embodiments and features may be made without departing from the teachings of the disclosure or the scope of the invention as defined by the appended claims.

What is claimed is:

1. A plurality of vertically aligned nano- or micro-wires, each nano- or micro-wire of the plurality of nano- or micro-wires comprising:
   at least one first segment comprising a first semiconducting material, and
   at least one second segment comprising a second semiconducting material different than the first semiconducting material,
   wherein the at least first segment and the at least second segment are axially integrated
      wherein each first segment of the at least one first segment is separated from each second segment of the at least one second segment by an ohmic contact, wherein the ohmic contact has a graded composition to obtain lattice matching and includes a tunnel junction;
   wherein each nano- or micro-wire of the plurality of nano- or micro-wires has a dimension comprising a mean diameter of about 500 nm to about 10 micrometers and a mean length of about 1 micrometer to 1 mm and having an aspect ratio of greater than 1; wherein at least a portion of each nano- or micro-wire of the plurality of nano- or micro-wires contacts a liquid and wherein at least one end of each nano- or microwire of the plurality of nano- or micro-wires is coated with a hydrogen or oxygen evolution catalyst; and
   each nano- or micro-wire of the plurality of nano- or micro-wires is partially embedded in an ion conducting material with the at least one end coated with the hydrogen or oxygen evolution catalyst is free of the ion conducting material.

2. The plurality of nano- or micro-wires of claim 1, wherein the ohmic contact and that at least one second segment comprise a semiconducting material individually selected from the group consisting of TiO$_2$, CaTiO$_3$, SrTiO$_3$, Sr$_3$Ti$_2$O$_7$, Sr$_4$Ti$_3$O$_{10}$, Rb$_2$La$_2$Ti$_3$O$_{10}$, Cs$_2$La$_2$Ti$_3$O$_{10}$, CsLa$_2$Ti$_2$NbO$_{10}$, La$_2$TiO$_5$, La$_2$Ti$_3$O$_9$, La$_2$Ti$_2$O$_7$, La$_2$Ti$_2$O$_7$:Ba, KaLaZr$_{0.3}$Ti$_{0.7}$O$_4$, La$_4$CaTi$_5$O$_{17}$, KTiNbO$_5$, Na$_2$Ti$_6$O$_{13}$, BaTi$_4$O$_9$, Gd$_2$Ti$_2$O$_7$, Y$_2$Ti$_2$O$_7$, ZrO$_2$, K$_4$Nb$_6$O$_{17}$, Rb$_4$Nb$_6$O$_{17}$, Ca$_2$Nb$_2$O$_7$, Sr$_2$Nb$_2$O$_7$, Ba$_5$Nb$_4$O$_{15}$, NaCa$_2$Nb$_3$O$_{10}$, ZnNb$_2$O$_6$, Cs$_2$Nb$_4$O$_{11}$, La$_3$NbO$_7$, Ta$_2$O$_5$, KsPrTa$_5$O$_{15}$, K$_3$Ta$_3$Si$_2$O$_{13}$, K$_3$Ta$_3$B$_2$O$_{12}$, LiTaO$_3$, KTaO$_3$, AgTaO$_3$, KTaO$_3$:Zr, NaTaO$_3$:La, NaTaO$_3$:Sr, Na$_2$Ta$_2$O$_6$, CaTa$_2$O$_6$, SrTa$_2$O$_6$, NiTa$_2$O$_6$, Rb$_4$Ta$_6$O$_{17}$, Ca$_2$Ta$_2$O$_7$, Sr$_2$Ta$_2$O$_7$, K$_2$SrTa$_2$O$_7$, RbNdTa$_2$O$_7$, H$_2$La$_{2/3}$Ta$_2$O$_7$, K$_2$Sr$_{1.5}$Ta$_3$O$_{10}$, LiCa$_2$Ta$_3$O$_{10}$, KBa$_2$Ta$_3$O$_{10}$, Sr$_5$Ta$_4$O$_{15}$, Ba$_2$Ta$_4$O$_{15}$, H$_{1.8}$Sr$_{0.81}$Bi$_{0.19}$Ta$_2$O$_7$, Mg—Ta Oxide, LaTaO$_4$, LaTaO$_7$, PbWO$_4$, RbWNbO$_6$, RbWTaO$_6$, CeO$_2$:Sr, BaCeO$_3$, NaInO$_2$, CaIn$_2$O$_4$, SrIn$_2$O$_4$, LaInO$_3$, Y$_x$In$_{2-x}$O$_3$, NaSbO$_3$, CaSb$_2$O$_6$, Ca$_2$Sb$_2$O$_7$, Sr$_2$Sb$_2$O$_7$, Sr$_2$SnO$_4$, ZnGa$_2$O$_4$, Zn$_2$GeO$_4$, LiInGeO$_4$, Ga$_2$O$_3^b$, Ga$_2$O$_3$:Zn$^c$, Na$_2$Ti$_3$O$_7$, K$_2$Ti$_2$O$_5$, K$_2$Ti$_4$O$_9$, Cs$_2$Ti$_2$O$_5$, H$^+$—Cs$_2$Ti$_2$O$_5$, Cs$_2$Ti$_5$O$_{11}$, Cs$_2$Ti$_6$O$_{13}$, H$^+$—CsTiNbO$_5$, H$^+$—CsTi$_2$NbO$_7$, SiO$_2$-pillared K$_2$Ti$_4$O$_9$, SiO$_2$-pillared K$_2$Ti$_{2.7}$Mn$_{0.3}$O$_7$, Na$_2$W$_4$O$_{13}$, H$^+$—KLaNb$_2$O$_7$, H$^+$—RbLaNb$_2$O$_7$, H$^+$—CsLaNb$_2$O$_7$, H$^+$—KCa$_2$Nb$_3$O$_{10}$, SiO$_2$-pillared KCa$_2$Nb$_3$O$_{10}$, ex-Ca$_2$Nb$_3$O$_{10}$/K$^+$ nanosheet$^{4)}$, Restacked ex-Ca$_2$Nb$_3$O$_{10}$/Na$^+$, H$^+$—RbCa$_2$Nb$_3$O$_{10}$, H$^+$—CsCa$_2$Nb$_3$O$_{10}$, H$^+$—KSr$_2$Nb$_3$O$_{10}$, H$^+$—KCa$_2$NaNb$_4$O$_{13}$, Bi$_2$W$_2$O$_9$, Bi$_2$Mo$_2$O$_9$, Bi$_4$Ti$_3$O$_{12}$, BaBi$_4$Ti$_4$O$_{15}$, Bi$_3$TiNbO$_9$, PbMoO$_4$, (NaBi)$_{0.5}$MoO$_4$, (AgBi)$_{0.5}$MoO$_4$, (NaBi)$_{0.5}$WO$_4$, (AgBi)$_{0.5}$WO$_4$, Ga$_{1.14}$In$_{0.86}$O$_3$, β-Ga$_2$O$_3$, Ti$_{1.5}$Zr$_{1.5}$(PO$_4$)$_4$, WO$_3$, Bi$_2$WO$_6$, Bi$_2$MoO$_6$, Bi$_2$Mo$_3$O$_{12}$, Zn$_3$V$_2$O$_8$, Na$_{0.5}$Bi$_{1.5}$VMoO$_8$, In$_2$O$_3$(ZnO)$_3$, SrTiO$_3$:Cr/Sb, SrTiO$_3$:Ni/Ta, SrTiO$_3$:Cr/Ta, SrTiO$_3$:Rh, CaTiO$_3$:Rh, La$_2$Ti$_2$O$_7$:Cr, La$_2$Ti$_2$O$_7$:Fe, TiO$_2$:Cr/Sb, TiO$_2$:Ni/Nb, TiO$_2$:Rh/Sb, PbMoO$_4$:Cr, RbPb$_2$Nb$_3$O$_{10}$, PbBi$_2$Nb$_2$O$_9$, BiVO$_4$, BiCu$_2$VO$_6$, BiZn$_2$VO$_6$, SnNb$_2$O$_6$, AgNbO$_3$, Ag$_3$VO$_4$, AgLi$_{1/3}$Ti$_{2/3}$O$_2$, AgLi$_{1/3}$Sn$_{2/3}$O$_2$, LaTiO$_2$N, Ca$_{0.25}$La$_{0.75}$TiO$_{2.25}$N$_{0.75}$, TaON, Ta$_3$N$_5$, CaNbO$_2$N, CaTaO$_2$N, SrTaO$_2$N, BaTaO$_2$N, LaTaO$_2$N, Y$_2$Ta$_2$O$_5$N$_2$, TiN$_x$O$_y$F$_z$, Sm$_2$Ti$_2$O$_5$S$_2$, La—In oxysulfide, GaAs, GaP, GaAs$_x$P$_{1-x}$, Al$_x$Ga$_{1-x}$, As, Al$_x$Ga$_{1-x}$As$_y$P$_{1-y}$, In$_x$Ga$_{1-x}$As, In$_x$Ga$_{1-x}$P, In$_x$Ga$_{1-x}$As$_y$P$_{1-y}$, Al$_x$In$_{1-x}$As$_y$P$_{1-y}$, Al$_x$Ga$_{1-x}$As$_y$N$_z$P$_{1-y-z}$, In$_x$Ga$_{1-x}$As$_y$N$_z$P$_{1-y-z}$, Zn$_3$P$_2$, Zn$_3$S$_2$, and ZnP$_x$S$_{1-x}$ ($0\leq x\leq 1$, $0\leq y\leq 1$, $0\leq z\leq 1$, $0\leq y+z\leq 1$).

3. The plurality of nano- or micro-wires of claim 1, wherein the first semiconducting material is silicon.

4. The plurality of nano- or micro-wires of claim 1, wherein the at least one first segment is surface coated by a passivation layer.

5. The plurality of nano- or micro-wires of claim 1, wherein the ion conducting material forms a membrane comprising the plurality of nano- or micro-wires embedded in the ion conducting material extending from and/or through a first surface to and/or through a second surface of the membrane.

6. The plurality of nano- or micro-wires of claim 1, wherein the first semiconducting material includes a radial p-n junction or a radial p-i-n junction.

7. The plurality of nano- or micro-wires claim 6, wherein the second different semiconducting material includes a radial p-n junction or a radial p-i-n junction.

8. The plurality of nano- or micro-wires claim 1, wherein the plurality of nano- or micro-wires are included in a water splitting device.

9. The plurality of nano- or micro-wires of claim 1, wherein one end of each nano- or micro-wire of the plurality of nano- or micro-wires is in contact with the liquid.

10. The plurality of nano- or micro-wires of claim 1, wherein the plurality of nano- or micro-wires are epitaxially grown.

11. The plurality of nano- or micro-wires of claim 1, wherein the ohmic contact is in physical contact with both the at least one first segment and the at least one second segment of each nano- or micro-wire of the plurality of nano- or micro-wires.

* * * * *